US009672931B2

(12) United States Patent
Yoon et al.

(10) Patent No.: US 9,672,931 B2
(45) Date of Patent: Jun. 6, 2017

(54) NON-VOLATILE MEMORY DEVICE, MEMORY SYSTEM, AND METHODS OF OPERATING THE DEVICE AND SYSTEM

(71) Applicants: Seok-Min Yoon, Seoul (KR); Myung-Hoon Choi, Suwon-si (KR)

(72) Inventors: Seok-Min Yoon, Seoul (KR); Myung-Hoon Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/995,534

(22) Filed: Jan. 14, 2016

(65) Prior Publication Data

US 2016/0260496 A1    Sep. 8, 2016

(30) Foreign Application Priority Data

Mar. 4, 2015   (KR) .......................... 10-2015-0030552

(51) Int. Cl.
| | | |
|---|---|---|
| *G11C 16/16* | (2006.01) | |
| *G11C 16/34* | (2006.01) | |
| *G11C 16/04* | (2006.01) | |
| *G11C 16/14* | (2006.01) | |

(52) U.S. Cl.
CPC ...... *G11C 16/3445* (2013.01); *G11C 16/0483* (2013.01); *G11C 16/14* (2013.01); *G11C 16/344* (2013.01)

(58) Field of Classification Search
CPC .... G11C 16/16; G11C 16/344; G11C 16/3445
USPC ....................................... 365/185.29, 185.33
See application file for complete search history.

(56) References Cited

U.S. PATENT DOCUMENTS

| | | | |
|---|---|---|---|
| 7,272,050 B2 * | 9/2007 | Han | G11C 16/0483 365/185.22 |
| 7,529,138 B2 * | 5/2009 | Park | G11C 16/16 365/185.17 |
| 7,551,492 B2 * | 6/2009 | Kim | G11C 8/08 365/185.17 |
| 7,839,684 B2 | 11/2010 | Kao et al. | |
| 7,995,401 B2 * | 8/2011 | Kim | G11C 8/08 365/185.12 |
| 8,213,240 B2 * | 7/2012 | Kim | G11C 8/08 365/185.12 |
| 8,526,241 B2 | 9/2013 | Shirakawa | |

(Continued)

FOREIGN PATENT DOCUMENTS

| | | |
|---|---|---|
| KR | 10-2005-0108978 A | 11/2005 |
| KR | 10-2012-0034828 A | 4/2012 |

*Primary Examiner* — Son Mai
(74) *Attorney, Agent, or Firm* — Volentine & Whitt, PLLC

(57) ABSTRACT

Provided is a method of operating a non-volatile memory device including a plurality of strings, each string including a plurality of memory cells vertically stacked on a substrate. The method includes performing an erase operation on memory cells corresponding to a plurality of string selection lines, performing an erase verification operation on first strings connected to a first string selection line from among the plurality of string selection lines, storing fail column information corresponding to a first fail string, which is erase-failed, from among the first strings, and performing an erase verification operation on second strings connected to a second string selection line from among the plurality of string selection lines, when the first strings are erase-passed.

20 Claims, 34 Drawing Sheets

(56) References Cited

U.S. PATENT DOCUMENTS

| | | | |
|---|---|---|---|
| 8,559,235 B2 * | 10/2013 | Yoon | G11C 16/0483 365/185.18 |
| 8,559,237 B2 * | 10/2013 | Kim | G11C 8/08 365/185.17 |
| 8,634,246 B2 | 1/2014 | Kang et al. | |
| 8,767,467 B2 | 7/2014 | Parat et al. | |
| 8,837,224 B2 | 9/2014 | Kim et al. | |
| 8,917,558 B2 | 12/2014 | Han et al. | |
| 2010/0306582 A1 | 12/2010 | Han et al. | |
| 2012/0051136 A1 * | 3/2012 | Kang | G11C 16/344 365/185.17 |
| 2012/0051143 A1 * | 3/2012 | Yoon | G11C 16/0483 365/185.22 |
| 2012/0284469 A1 | 11/2012 | Seo | |
| 2013/0336061 A1 * | 12/2013 | Kim | G11C 16/0483 365/185.11 |
| 2014/0063949 A1 * | 3/2014 | Tokiwa | G11C 16/16 365/185.11 |
| 2014/0092685 A1 | 4/2014 | Yoon et al. | |
| 2014/0310448 A1 | 10/2014 | Nam et al. | |
| 2015/0138882 A1 | 5/2015 | Han et al. | |
| 2015/0170749 A1 | 6/2015 | Park et al. | |

\* cited by examiner

FIG. 7

| | |
|---|---|
| SSL | Float |
| WL | Vwe1 |
| GSL | Float |
| Substrate | Vers1 |

FIG. 9

| BL | Vpre(Vcc) |
|---|---|
| Selected SSL | Vssl2(Vcc) |
| Unselected SSL | Vssl3(Vss) |
| WL | Vvfy(Vss) |
| GSL | Vgsl2(Vcc) |
| CSL | Vcsl(Vss) |

FIG. 14

| SSL | P/F | Num of Fail |
|---|---|---|
| 1 | Pass | 1 |
| 2 | Fail | 20 |
| 3 | Pass | 0 |
| 4 | Pass | 2 |

FIG. 30A

|        | Col.1 | Col.2 | Col.3 | Col.4 | Col.5 | Col.6 | Col.7 | Col.8 |
|--------|-------|-------|-------|-------|-------|-------|-------|-------|
| Block1 | 1     | 0     | 0     | 0     | 1     | 0     | 0     | 0     |
| Block2 | 1     | 0     | 0     | 0     | 0     | 0     | 1     | 0     |
| ...    | ...   | ...   | ...   | ...   | ...   | ...   | ...   | ...   |
| BlockN | 1     | 0     | 0     | 0     | 0     | 0     | 0     | 0     |

FIG. 30B

|  | Col.1 | Col.2 | Col.3 | Col.4 | Col.5 | Col.6 | Col.7 | Col.8 |
|---|---|---|---|---|---|---|---|---|
| PGM Data | 0 | 1 | 0 | 1 | 0 | 1 | 1 | 0 |
| Loading Data | 1 | 1 | 0 | 1 | 0 | 1 | 1 | 0 |

NON-VOLATILE MEMORY DEVICE, MEMORY SYSTEM, AND METHODS OF OPERATING THE DEVICE AND SYSTEM

CROSS-REFERENCE TO RELATED APPLICATION

This application claims the benefit of Korean Patent Application No. 10-2015-0030552, filed on Mar. 4, 2015, in the Korean Intellectual Property Office, the disclosure of which is incorporated herein in its entirety by reference.

BACKGROUND

The disclosure relates to a memory device, and more particularly, to a non-volatile memory device, a memory system, a method of operating the non-volatile memory device, and a method of operating the memory system.

Memory devices may be used to store data and be categorized as either volatile memory devices or non-volatile memory devices. A flash memory device, which is an example of a non-volatile memory device, may be used for portable phones, digital cameras, personal digital assistants (PDAs), portable computer devices, fixed computer devices, and other devices.

SUMMARY

According to an aspect of the disclosure, there is provided a method of operating a non-volatile memory device including a plurality of strings, each string including a plurality of memory cells vertically stacked on a substrate. The method includes performing an erase operation on memory cells corresponding to a plurality of string selection lines, performing an erase verification operation on first strings connected to a first string selection line from among the plurality of string selection lines, storing fail column information corresponding to a first fail string, which is erase-failed, from among the first strings, and performing an erase verification operation on second strings connected to a second string selection line from among the plurality of string selection lines, when the first strings are erase-passed.

According to another aspect of the disclosure, there is provided a method of operating a memory system including a non-volatile memory device comprising a plurality of strings, each string comprising a plurality of memory cells vertically stacked on a substrate, and a memory controller configured to control the non-volatile memory device. The method includes transmitting an erase command and an erase address from the memory controller to the non-volatile memory device, performing an erase operation on memory cells corresponding to a plurality of string selection lines according to the erase address in response to the erase command and the erase address, performing an erase verification operation on first strings connected to a first string selection line from among the plurality of string selection lines, performing an erase verification operation on second strings connected to a second string selection line from among the plurality of string selection lines, when the first strings are erase-passed, and performing an erase operation again on the memory cells when the first strings are erase-failed. The performing of the erase verification operation on the first strings includes applying an erase verification voltage to the first strings, and storing fail column information corresponding to a first fail string, which is erase-failed, from among the first strings.

According to another aspect of the disclosure, there is provided a method executed by a non-volatile memory having a plurality of first strings, each of the first strings including a plurality of first memory cells commonly addressed by one of a plurality of bit lines and each of the first strings commonly addressed by a first string selection line and a different one of the plurality of bit lines. The method includes executing an erase operation on the first memory cells of the first strings addressed by the first string selection line and the bit lines; executing an erase-verification operation on the first memory cells of the first strings addressed by the first string selection line and the bit lines; and determining separately for each of the first strings commonly addressed by the first string selection line and a different one of the bit lines whether all first memory cells of the first string are erased, based upon the outcome of the executed erase-verification operation.

BRIEF DESCRIPTION OF THE DRAWINGS

Exemplary embodiments of the disclosure will be more clearly understood from the following detailed description taken in conjunction with the accompanying drawings in which:

FIG. 7 is a table showing conditions of voltages applied to the first memory block of FIG. 5 during an erase operation;

FIG. 9 is a table showing conditions of voltages applied to the first memory block of FIG. 5 during an erase verification operation;

FIG. 14 is a table showing the number of fail strings for each string selection line according to an exemplary embodiment;

FIG. 30A is a table showing fail columns of respective memory blocks according to an exemplary embodiment;

FIG. 30B is a table showing data loading patterns of respective columns according to an exemplary embodiment;

DETAILED DESCRIPTION OF THE EMBODIMENTS

Figure 1:
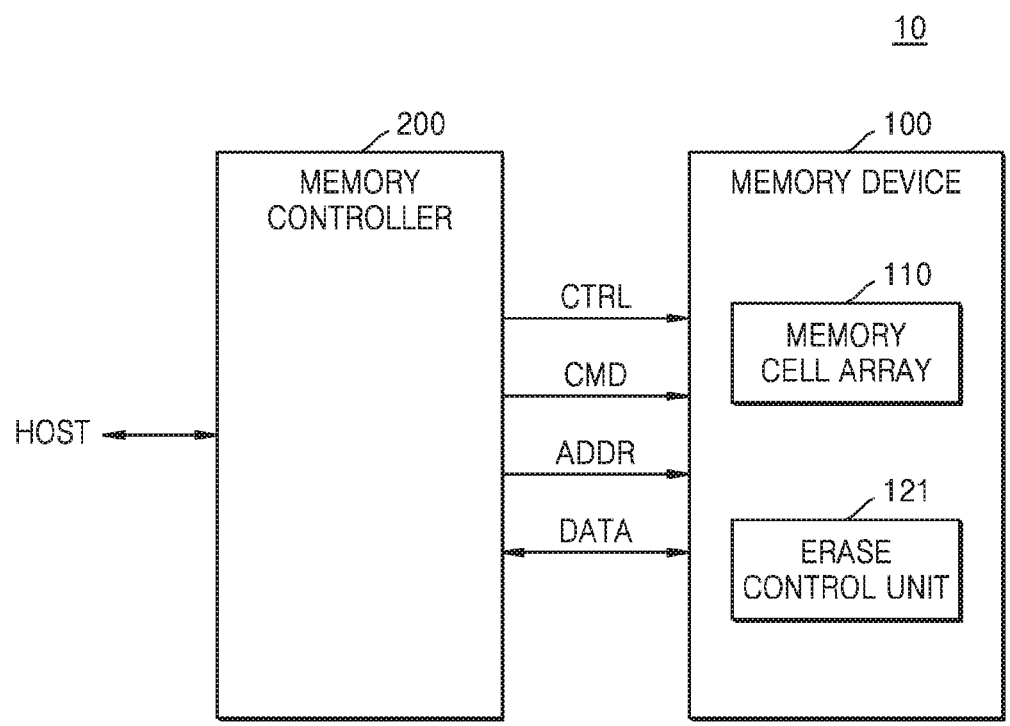
FIG. 1 is a schematic block diagram of a memory system according to an exemplary embodiment.

As used herein, the term "and/or" includes any and all combinations of one or more of the associated listed items. Expressions such as "at least one of," when preceding a list of elements, modify the entire list of elements and do not modify the individual elements of the list.

The present disclosure will now be described more fully hereinafter with reference to the accompanying drawings, in which exemplary embodiments of the disclosure are shown. These embodiments are provided so that this disclosure is thorough and complete and fully conveys the scope of the disclosure to one of ordinary skill in the art. Accordingly, while the disclosure can be modified in various ways and take on various alternative forms, specific embodiments thereof are shown in the drawings and described in detail below as examples. There is no intent to limit the disclosure to the particular forms disclosed. On the contrary, the disclosure is to cover all modifications, equivalents, and alternatives falling within the spirit and scope of the appended claims. Like reference numerals refer to like elements throughout. In the drawings, the thicknesses of layers and regions may be exaggerated for clarity.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless explicitly so defined herein.

FIG. 1 is a schematic block diagram of a memory system 10 according to an exemplary embodiment.

Referring to FIG. 1, the memory system 10 may include a memory device 100 and a memory controller 200. The memory device 100 may include a memory cell array 110 and an erase control unit 121.

The memory cell array 110 may include a plurality of memory cells (not shown). For example, the plurality of memory cells may be flash memory cells. Hereinafter, exemplary embodiments will be described on the assumption that the plurality of memory cells are NAND flash memory cells. In an exemplary embodiment, the plurality of memory cells may be three-dimensional (3D) vertical NAND (VNAND) flash memory cells (refer to FIGS. 4 and 5). In another exemplary embodiment, the plurality of memory cells may be two-dimensional (2D) horizontal NAND flash memory cells. However, the disclosure is not limited thereto. In another exemplary embodiment, the plurality of memory cells may be resistive memory cells, such as resistive RAM (RRAM) memory cells, phase-change RAM (PRAM) memory cells, or magnetic RAM (MRAM) memory cells.

In an exemplary embodiment, each of the memory cells included in the memory cell array 110 may be a single-level cell (SLC) configured to store 1-bit data. In another exemplary embodiment, each of the memory cells included in the memory cell array 110 may be a multi-level cell (MLC) configured to store 2-bit data. In yet another exemplary embodiment, each of the memory cells included in the memory cell array 110 may be a triple-level cell (TLC) configured to store 3-bit data. However, the disclosure is not limited thereto. In another exemplary embodiment, each of the memory cells included in the memory cell array 110 may store data having 4 bits or more.

The erase control unit 121 may control an erase operation and an erase verification operation on the memory cells included in the memory cell array 110. According to the present exemplary embodiment, the erase control unit 121 may perform an erase operation in units of memory blocks, perform an erase verification operation in units of string selection lines, and store fail column information as a result of the erase verification operation performed in the units of string selection lines. Detailed operations of the erase control unit 121 will be described in detail below with reference to FIGS. 2 to 16.

The memory controller 200 may control the memory device 100 to read data stored in the memory device 100 or write data in the memory device 100 in response to read/write requests from a host HOST. Specifically, the memory controller 200 may provide an address ADDR, a command CMD, and a control signal CTRL to the memory device 100 and control a program operation (or a write operation), a read operation, and an erase operation on the memory device 100. Also, data DATA to be programmed and read data DATA may be transmitted and received between the memory controller 200 and the memory device 100.

Although not shown, the memory controller 200 may include a random access memory (RAM), a processing unit, a host interface, and a memory interface. The RAM may be used as an operation memory of the processing unit, and the processing unit may control an operation of the memory controller 200. The host interface may include a protocol configured to exchange data between the host HOST and the memory controller 200. For example, the memory controller 200 may communicate with the outside (e.g., the host HOST) through at least one of various interface protocols, such as a universal serial bus (USB), multimedia card (MMC), peripheral component interface-express (PCI-E), advanced technology attachment (ATA), serial ATA (SATA), parallel-ATA (PATA), small computer system interface (SCSI), enhanced small device interface (ESDI), and intelligent drive electronics (IDE).

Figure 2:
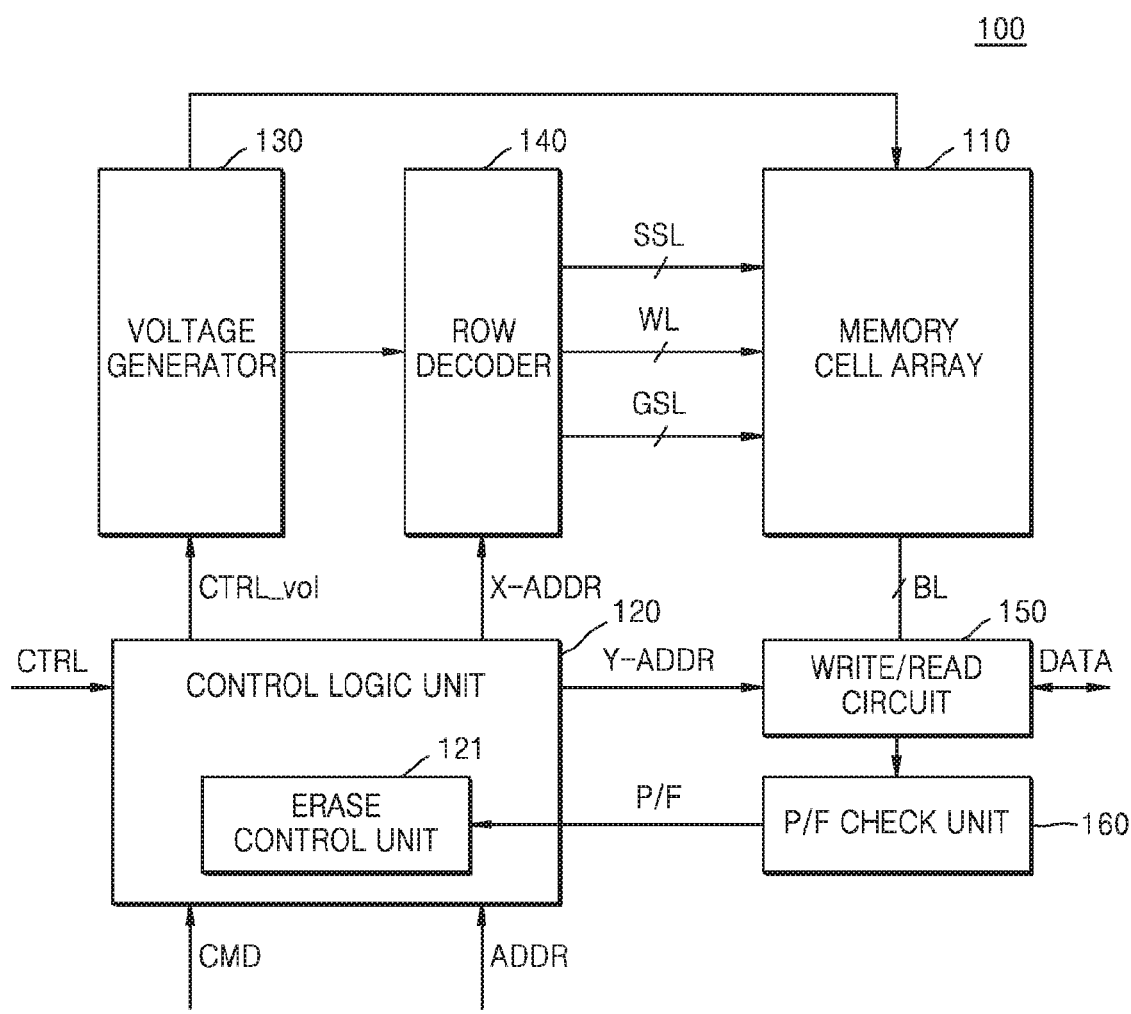
FIG. 2 is a block diagram of a memory device according to an exemplary embodiment.

FIG. 2 is a block diagram of a memory device 100 according to an exemplary embodiment.

Referring to FIG. 2, the memory device 100 may include a memory cell array 110, a control logic unit 120, a voltage generation unit 130, a row decoder 140, a write/read circuit 150, and a pass/fail check unit 160. Although not shown, the memory device 100 may further include a data I/O circuit or an I/O interface.

The memory cell array 110 may include a plurality of memory cells and be connected to word lines WL, string selection lines SSL, ground selection lines GSL, and bit lines BL. Specifically, the memory cell array 110 may be connected to the row decoder 140 through the word lines WL, the string selection lines SSL, and the ground selection lines GSL, and connected to the write/read circuit 150 through the bit lines BL.

The memory cell array 110 may include at least one of a single-level cell block including single-level cells, a multi-level cell block including multi-level cells, and a triple-level cell block including triple-level cells. In other words, some of a plurality of memory blocks included in the memory cell array 110 may be single-level cell blocks, and other memory blocks may be multi-level cell blocks or triple-level cell blocks.

The control logic unit 120 may output various control signals for writing data in the memory cell array 110 or reading data from the memory cell array 110 based on a command CMD, an address ADDR, and a control signal CTRL received from the memory controller 200. Thus, the control logic unit 120 may generally control various operations of the memory device 100.

Various control signals output by the control logic unit 120 may be provided to the voltage generation unit 130, the row decoder 140, and the write/read circuit 150. Specifically, the control logic unit 120 may provide a voltage control signal CTRL_vol to the voltage generation unit 130, provide a row address X-ADDR to the row decoder 140, and provide a column address Y-ADDR to the write/read circuit 150. However, the disclosure is not limited thereto, and the control logic unit 120 may further provide other control signals to the voltage generation unit 130, the row decoder 140, and the page buffer 150.

The voltage generation unit 130 may generate various kinds of voltages for performing program, read, and erase operations on the memory cell array 110 based on a voltage control signal CTRL_vol. Specifically, the voltage generation unit 130 may generate a word line driving voltage for driving word lines WL, for example, a program voltage (or a write voltage), a read voltage, an inhibition voltage, an erase verification voltage, or a program verification voltage. Also, the voltage generation unit 130 may further generate a string selection line driving voltage for driving string selection lines SSL and a ground selection line driving voltage for driving ground selection lines GSL. Also, the voltage generation unit 130 may further generate an erase voltage to be provided to the memory cell array 110.

The row decoder 140 may select some word lines WL from among the word lines WL in response to the row address X-ADDR received from the control logic unit 120. Specifically, during a read operation, the row decoder 140 may apply a read voltage to the selected word line and apply an inhibition voltage to unselected word lines. Also, during a program operation, the row decoder 140 may apply a program voltage to the selected word line and apply an inhibition voltage to the unselected word lines. Furthermore, the row decoder 140 may select some string selection lines SSL from among the string selection lines SSL or select some ground selection lines GSL from among the ground selection lines GSL in response to the row address X-ADDR received from the control logic unit 120.

The write/read circuit 150 may be connected to the memory cell array 110 through the bit lines BL, and select some bit lines from the bit lines BL in response to the column address Y-ADDR received from the control logic unit 120. Specifically, during the read operation, the write/read circuit 150 may operate as a sense amplifier and output data DATA stored in the memory cell array 110. Meanwhile, during a program operation, the write/read circuit 150 may operate as a write driver and store desired data DATA in the memory cell array 110.

In the present exemplary embodiment, the write/read circuit 150 may store an erase verification result for each column during an erase verification operation performed on the memory cells included in the memory cell array 110. Specifically, when a specific string is determined as erase-failed as a result of the erase verification operation, the write/read circuit 150 may store a fail bit in a fail bit latch (not shown) corresponding to the specific string. The write/read circuit 150 will be described in detail later with reference to FIGS. 11 and 12.

The pass/fail check unit 160 may receive data sensed by the write/read circuit 150 during an erase verification operation, and determine whether an erase operation is passed or failed based on the received data. Also, the pass/fail check unit 160 may transmit a pass/fail signal P/F to the control logic unit 120 based on the determination result. In the present exemplary embodiment, the pass/fail check unit 160 may store a critical value for determining an erase pass and an erase failure, and compare data received by the write/read circuit 150 or the number of fail bits included in the data received by the write/read circuit 150 with the stored critical value, and determine the erase operation as failed when the number of the fail bits is equal to or higher than the critical value. The pass/fail check unit 160 will be described in detail below with reference to FIGS. 13 to 15.

In the present exemplary embodiment, the control logic unit 120 may include the erase control unit 121. The erase control unit 121 may determine whether an erase operation or an erase verification operation is to be performed in response to a pass/fail signal P/F. When the erase control unit 121 receives a fail signal from the pass/fail check unit 160, the erase control unit 121 may control the voltage generation unit 130, the row decoder 140, and the write/read circuit 150 to erase a selected memory block of the memory cell array 110. Meanwhile, when the erase control unit 121 receives a pass signal from the pass/fail check unit 160, the erase control unit 121 may control the voltage generation unit 130, the row decoder 140, and the write/read circuit 150 to erase-verify strings connected to the next string selection line of the selected memory block of the memory cell array 110. The control logic unit 120 will be described in detail later with reference to FIG. 16.

Figure 3:
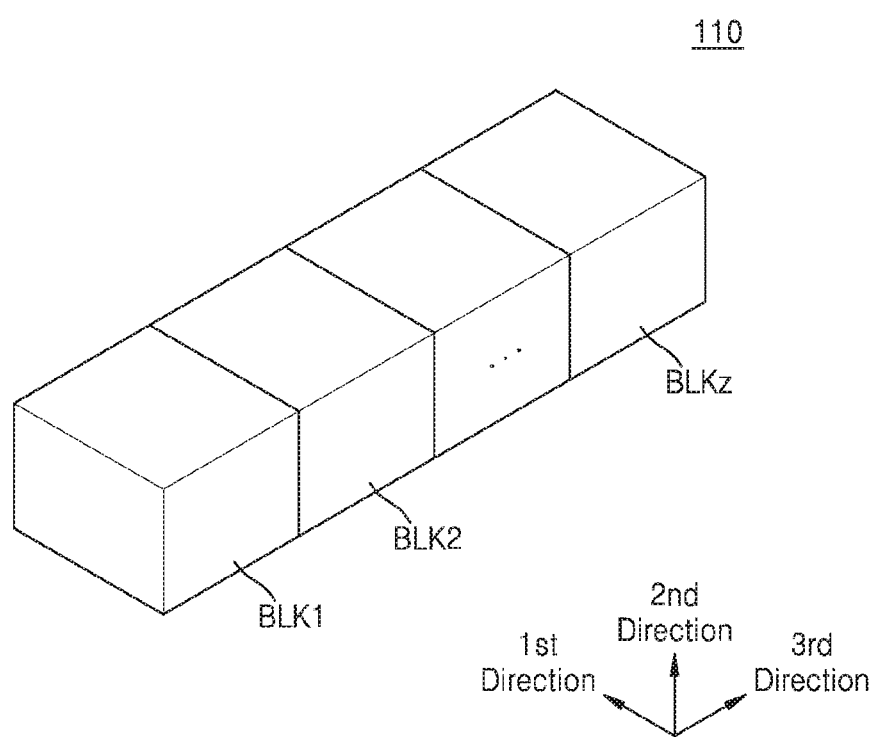
FIG. 3 is a diagram of a memory cell array included in the memory device of FIG. 2.

FIG. 3 is a diagram of the memory cell array 110 included in the memory device 100 of FIG. 2.

Referring to FIG. 3, the memory cell array 110 may include a plurality of memory blocks BLK1 to BLKz. Each of the memory blocks may have a 3D structure (or vertical structure). Specifically, each of the memory blocks may include structures extending in first to third directions. For example, each of the memory blocks may include a plurality of strings or NAND strings extending in the second direction. In this case, the plurality of strings may be provided a predetermined distance apart from one another in the first and third directions.

The memory blocks BLK1 to BLKz may be selected by the row decoder 140 shown in FIG. 2. For example, the row decoder 140 may select a memory block of the memory blocks BLK1 to BLKz, which corresponds to a block address. In this case, each of the memory blocks BLK1 to BLKz may be connected to a plurality of bit lines BL, a plurality of string selection lines SSL, a plurality of word lines WL, a ground selection line GSL, and a common source line CSL. The memory blocks BLK1 to BLKz will be described in further detail with reference to FIG. 4.

Figure 4:
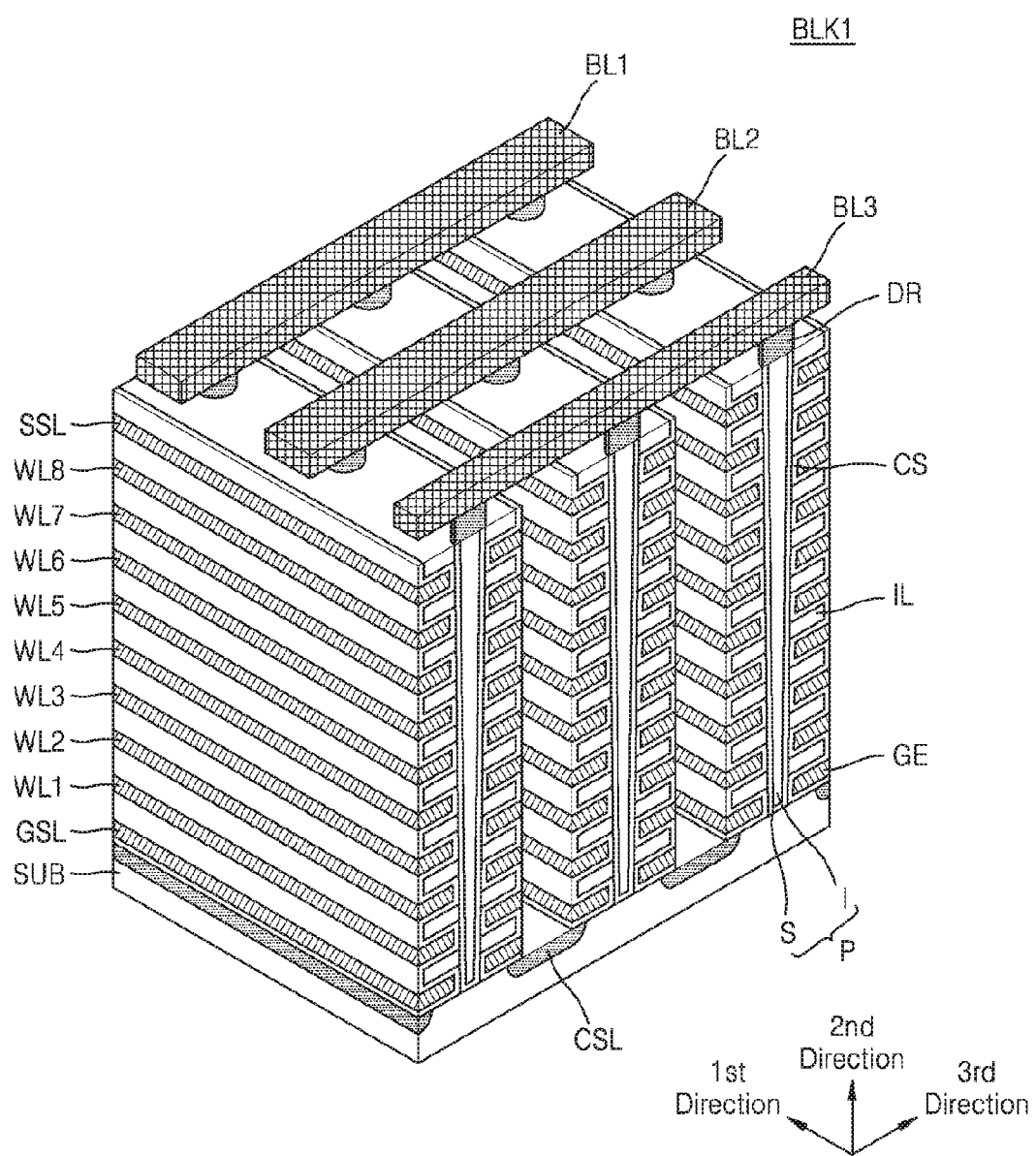
FIG. 4 is a perspective view of a first memory block, which is one of the memory blocks of FIG. 3, according to an exemplary embodiment.

FIG. 4 is a perspective view of a first memory block BLK1, which is one of the memory blocks BLK1 to BLKz of FIG. 3, according to an exemplary embodiment.

Referring to FIG. 4, the first memory block BLK1 may be formed in a vertical direction to a substrate SUB. Although FIG. 4 illustrates a case in which the first memory block BLK1 includes two selection lines GSL and SSL, eight word lines WL1 to WL8, and three bit line BL1 to BL3, the first memory block BLK1 is not limited thereto and may include more or fewer lines.

The substrate SUB may have a first conductivity type (e.g., p type) and extend in a first direction on the substrate SUB, and a common source line CSL doped with impurities of a second conductivity type (e.g., n type) may be provided. A plurality of insulating layers IL may be provided on a region of the substrate SUB between two adjacent common source lines CSL. The plurality of insulating layers IL may extend in the first direction and be sequentially disposed in a second direction. The plurality of insulating layers IL may be spaced a predetermined distance apart from one another in the second direction. For example, the plurality of insulating layers IL may include an insulating material, such as silicon oxide.

A plurality of pillars P may be provided on a region of the substrate SUB between two adjacent common source lines CSL. The plurality of pillars P may be sequentially disposed in the first direction and penetrate the plurality of insulating layers IL in the second direction. For example, the plurality of pillars P may penetrate the plurality of insulating layers IL and contact the substrate SUB. Specifically, a surface layer S of each of the pillars P may include a silicon material of a first type and function as a channel region. Meanwhile, the inside I of each of the pillars P may include an insulating material, such as silicon oxide, or an air gap.

A charge storage layer CS may be provided on a region between two adjacent common source lines CSL along exposed surfaces of the insulating layers IL, the pillars P, and the substrate SUB. For example, the charge storage layer CS may have an oxide-nitride-oxide (ONO) structure. Also, a gate electrode GE may be provided on an exposed surface of the charge storage layer CS in the region between the two adjacent common source lines CSL.

Drains DR may be respectively provided on the plurality of pillars P. For example, the drains DR may include a doped silicon material of a second conductivity type. Bit lines BL may be provided on the drains DR. The bit lines BL may extend in a third direction and be disposed a predetermined distance apart from one another in a first direction.

Figure 5:
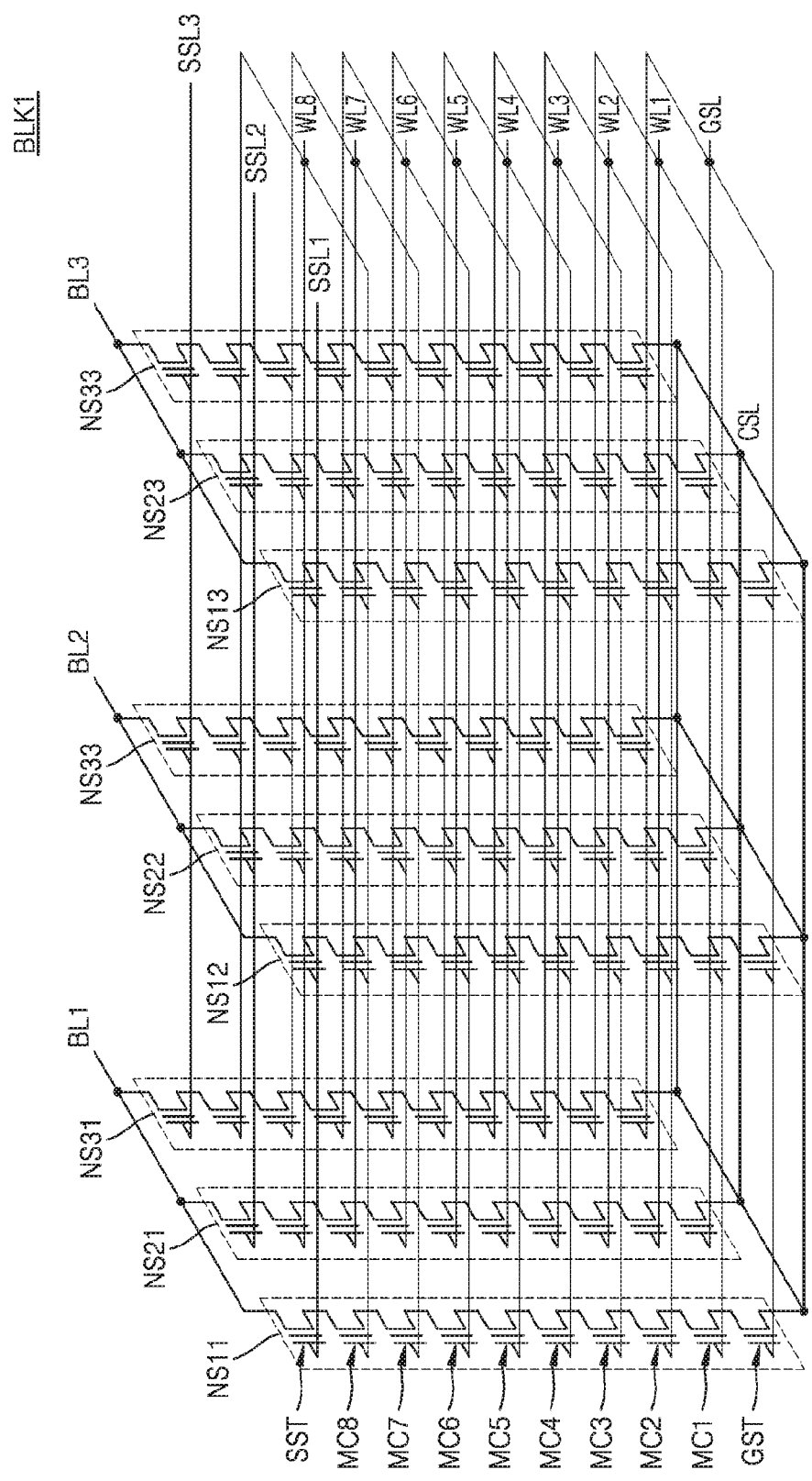
FIG. 5 is a circuit diagram of an equivalent circuit of the first memory block of FIG. 4.

FIG. 5 is a circuit diagram of an equivalent circuit of the first memory block BLK1 of FIG. 4.

Referring to FIG. 5, the first memory block BLK1 may be a VNAND flash memory, and each of the memory blocks BLK1 to BLKz shown in FIG. 3 may be embodied as in FIG. 5. The first memory block BLK1 may include a plurality of NAND strings NS11 to NS33, a plurality of word lines WL1 to WL8, a plurality of bit lines BL1 to BL3, a ground selection line GSL, a plurality of string selection lines SSL1 to SSL3, and a common source line CSL. Here, the number of NAND strings, the number of word lines, the number of bit lines, the number of ground selection lines, and the number of string selection lines may be variously changed according to exemplary embodiments.

NAND strings NS11, NS21, and NS31 may be provided between a first bit line BL1 and the common source line CSL, NAND strings NS12, NS22, and NS32 may be provided between a second bit line BL2 and the common source line CSL, and NAND strings NS13, NS23, and NS33 may be provided between a third bit line BL3 and the common source line CSL. Each of the NAND strings (e.g., NS11) may include a string selection transistor SST, a plurality of memory cells MC1 to MC8, and a ground selection transistor GST, which are connected in series. Hereinafter, the NAND string will be referred to as a string for brevity.

Strings connected in common to one bit line may constitute one column. For example, the strings NS11, NS21, and NS31 commonly connected to the first bit line BL1 may correspond to a first column, and the strings NS12, NS22, and NS32 commonly connected to the second bit line BL2 may correspond to a second column. The strings NS13, NS23, and NS33 commonly connected to the third bit line BL3 may correspond to a third column.

Strings connected to one string selection line may constitute one row. For example, the strings NS11, NS12, and NS13 connected to a first string selection line SSL1 may correspond to a first row, and the strings NS21, NS22, and NS23 connected to a second string selection line SSL2 may correspond to a second row. The strings NS31, NS32, and NS33 connected to a third string selection line SSL3 may correspond to a third row.

The string selection transistor SST may be connected to the string selection lines SSL1 to SSL3. The plurality of memory cells MC1 to MC8 may be respectively connected to the word lines WL1 to WL8. The ground selection transistor GST may be connected to the ground selection line GSL. The string selection transistor SST may be connected to the corresponding bit line BL, and the ground selection transistor GST may be connected to the common source line CSL.

Word lines (e.g., WL1) disposed at the same level may be commonly connected, and the string selection lines SSL1 to SSL3 may be separated from one another. For example, when memory cells that are connected to the first word line WL1 and belong to the string NS11, NS12, and NS13 are programmed, the first word line WL1 and the first string selection line SSL1 may be selected.

Figure 6:
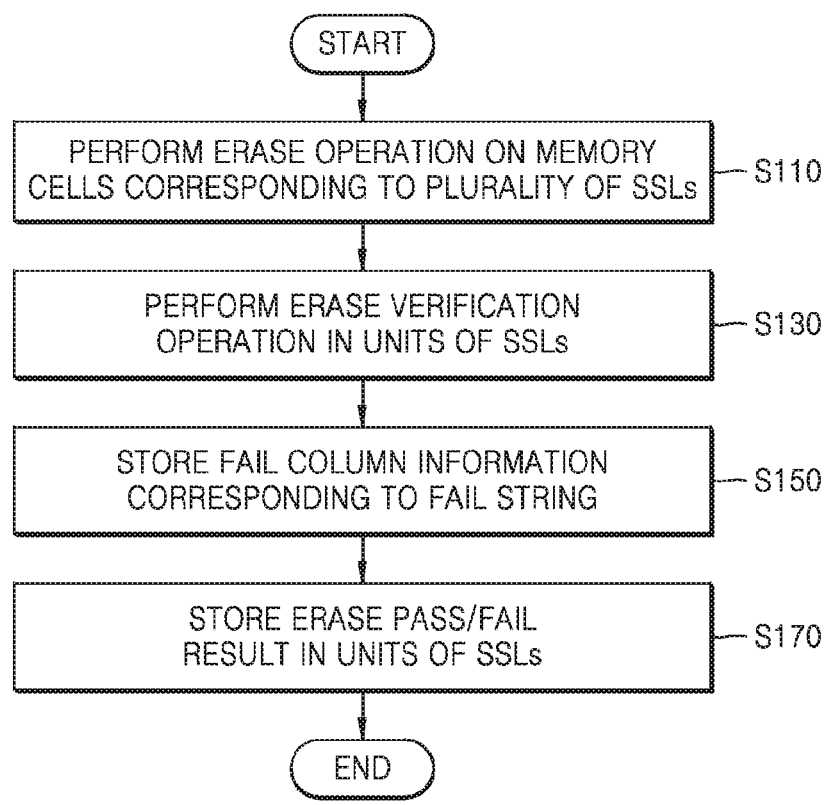
FIG. 6 is a flowchart of a method of operating a memory device according to an exemplary embodiment.

FIG. 6 is a flowchart of a method of operating a memory device according to an exemplary embodiment.

Referring to FIG. 6, the method of operating the memory device according to the present exemplary embodiment may be a method of performing an erase operation and an erase verification operation on a plurality of memory cells included in a memory cell array. Detailed descriptions presented with reference to FIGS. 1 to 5 may be applied to the method of operating the memory device according to the present exemplary embodiment. Hereinafter, the method of operating the memory device according to the present exemplary embodiment will be described in detail with reference to FIGS. 1 to 6.

In operation S110, an erase operation may be performed on memory cells corresponding to a plurality of string selection lines. In an exemplary embodiment, the memory cells corresponding to the plurality of string selection lines may constitute a memory block. However, the disclosure is not limited thereto. In another exemplary embodiment, the memory cells corresponding to the plurality of string selection lines may constitute a sub-memory block. For example, the sub-memory block may include memory cells connected to some word lines in a memory block. The erase operation will be described in detail with reference to FIGS. 7 and 8.

FIG. 7 is a table showing conditions of voltages applied to the first memory block BLK1 of FIG. 5 during an erase operation.

Referring to FIGS. 4, 5, and 7, when an erase operation is performed on the memory block BLK1, the string selection lines SSL1 to SSL3 may be floated, and a first word line erase voltage Vwe1 may be applied to the word lines WL1 to WL8. Also, the ground selection line GSL may be floated, and a first erase voltage Vers1 may be applied to the substrate SUB.

Figure 8:
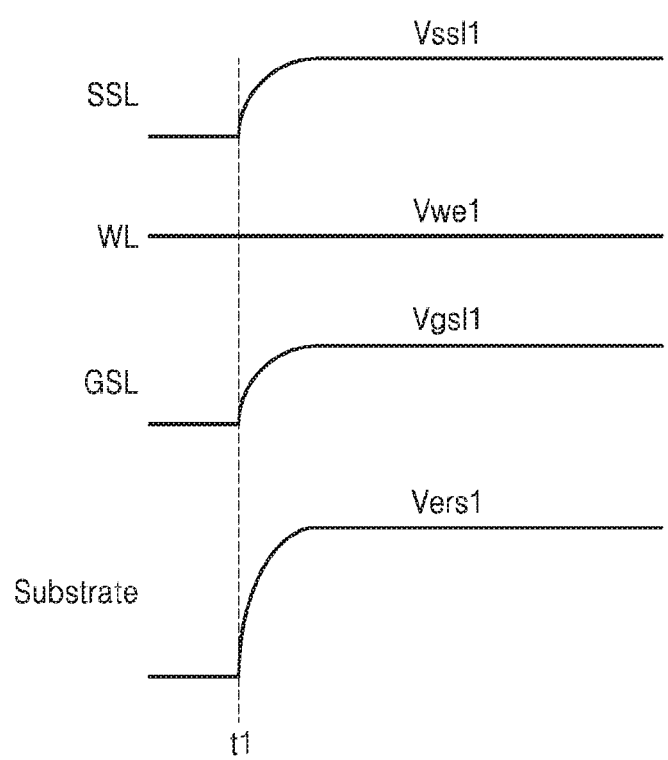
FIG. 8 is a timing diagram of a variation in voltage of the first memory block under the voltage conditions of FIG. 7.

FIG. 8 is a timing diagram of a variation in voltage of the first memory block BLK1 under the voltage conditions of FIG. 7.

Referring to FIGS. 4, 5, 7, and 8, a first erase voltage Vers1 may be applied to the substrate SUB at a first time point t1. In this case, the first erase voltage Vers1 may be a high voltage. Since the substrate SUB and the surface layer S have the same conductivity type, the first erase voltage Vers1 may be transmitted to the surface layer S of the string NS. Thus, a voltage of the surface layer S may correspond to the first erase voltage Vers1.

The ground selection line GSL may be floated at the first time point t1, and the voltage level of the ground selection line GSL may be affected via a capacitive coupling between the ground selection line GSL and the surface layer S. Accordingly, as the voltage of the surface layer S rises to the first erase voltage Vers1, a voltage of the ground selection line GSL may also rise. For example, the voltage of the ground selection line GSL may rise to a first ground selection line voltage Vgsl1. In this case, a difference between the first erase voltage Vers1 and the first ground selection line voltage Vgsl1 may not be so high as to cause Fowler-Nordheim (FN) tunneling, thus the ground selection transistor GST may be erase-inhibited.

A first word line erase voltage Vwe1 may be applied to the word lines WL at the first time point t1. In this case, the first word line erase voltage Vwe1 may be a low voltage (e.g., ground voltage). In this case, a difference between the first erase voltage Vers1 and the first word line erase voltage Vwe1 may be sufficiently high to cause FN tunneling so that the memory cells MC1 to MC8 may be erased. Here, the first erase voltage Vers1 and the first word line erase voltage Vwe1 may be determined to cause FN tunneling.

The string selection line SSL may be floated at the first time point t1, and the voltage level of the string selection line SSL may be affected via a capacitive coupling between the string selection line SSL and the surface layer S. Accordingly, as the voltage of the surface layer S rises to the first erase voltage Vers1, a voltage of the string selection line SSL may also rise. For example, the voltage of the string selection line SSL may rise to the first string selection line voltage Vssl1. In this case, a difference between the first erase voltage Vers1 and the first string selection line voltage Vssl1 may not be so high as to cause FN tunneling, thus the string selection transistor SST may be erase-inhibited.

The foregoing exemplary embodiment describes a case in which the first erase voltage Vers1 and the first word line erase voltage Vwe1 are applied at the first time point t1. However, the disclosure is not limited thereto, and the first erase voltage Vers1 and the first word line erase voltage Vwe1 may be sequentially applied in a predetermined order.

Referring back to FIG. 6, in operation S130, an erase verification operation may be performed on the memory cells on which the erase operation has been performed, in units of string selection lines. For example, when an erase verification operation is performed on strings NS11, NS12, and NS13 connected to a first string selection line SSL1 and the strings NS11, NS12, and NS13 are erase-passed, an erase verification operation may be performed on strings NS21, NS22, and NS23 connected to a second string selection line SSL2. When the strings NS21, NS22, and NS23 are erase-passed, an erase verification operation may be performed on strings NS31, NS32, and NS33 connected to a third string selection line SSL3. In this case, the order of the erase verification operation on the respective string selection lines SSL1, SSL2, and SSL3 may be changed according to exemplary embodiments. The erase verification operation will be described in detail with reference to FIGS. 9 and 10.

FIG. 9 is a table showing conditions of voltages applied to the first memory block BLK1 of FIG. 5 during an erase verification operation.

Referring to FIGS. 4, 5, and 9, when an erase operation is performed on the memory block BLK1, an erase verification operation may be performed in units of string selection lines SSL. When the erase verification operation is performed, a precharge voltage Vpre may be applied to bit lines BL1 to BL3. For example, the precharge voltage Vpre may be a power supply voltage Vcc.

According to the present exemplary embodiment, since the erase verification operation is performed in units of string selection lines SSL, one of the string selection lines SSL1 to SSL3 may be selected, and the remaining string selection lines may remain unselected. For example, when the first string selection line SSL1 is selected, the second and third string selection lines SSL2 and SSL3 may remain unselected. When the strings NS11 to NS13 of the first row connected to the first string selection line SSL1 are erase-passed, the second string selection line SSL2 or the third string selection line SSL3 may be selected.

A second string selection line voltage Vssl2 may be applied to the selected string selection line SSL. In this case, the second string selection line voltage Vssl2 may be a voltage for turning on the string selection transistors SST. For example, the second string selection line voltage Vssl2 may be a power supply voltage Vcc. Meanwhile, a third string selection line voltage Vssl3 may be applied to the unselected string selection lines SSL. In this case, the third string selection line voltage Vssl3 may be a voltage for turning off the string selection transistors SST. For example, the third string selection line voltage Vssl3 may be a ground voltage Vss.

An erase verification voltage Vvfy may be applied to the word lines WL1 to WL8. In this case, the erase verification voltage Vvfy may be set as an upper limit on threshold voltages required for memory cells that are in an erase state. For example, the erase verification voltage Vvfy may be a ground voltage Vss.

A second ground selection line voltage Vgsl2 may be applied to the ground selection line GSL. In this case, the second ground selection line voltage Vgsl2 may be a voltage for turning on the ground selection transistors GST. For example, the second ground selection line voltage Vgsl2 may be a power supply voltage Vcc. A common source line voltage Vcsl may be applied to the common source line CSL. In this case, the common source line voltage Vcsl may be at a lower level than a precharge voltage Vpre. For example, the common source line voltage Vcsl may be a ground voltage Vss.

Figure 10:
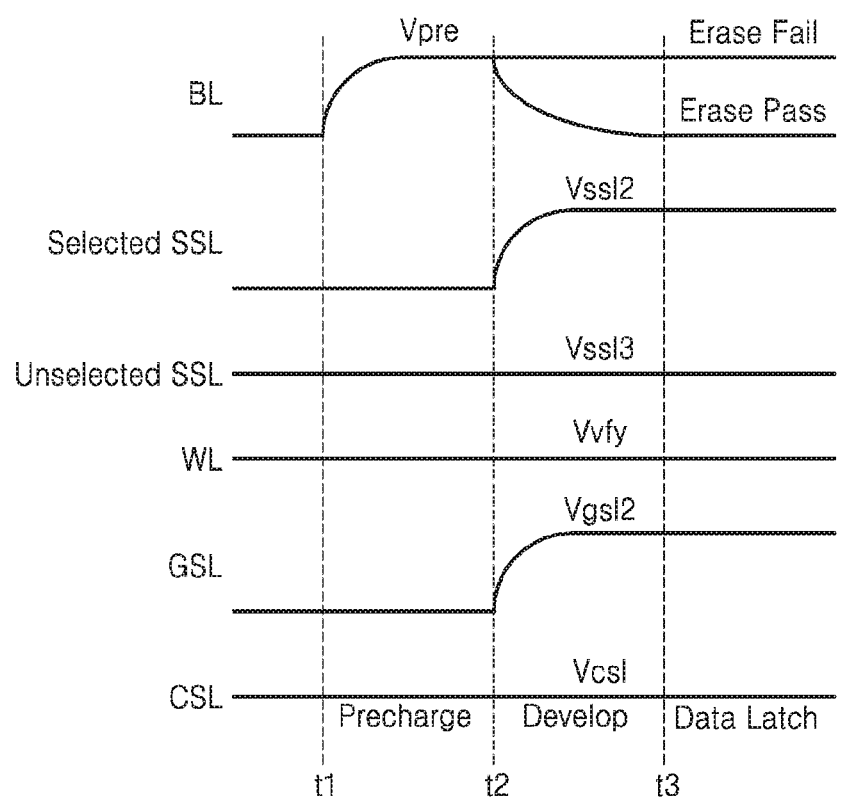
FIG. 10 is a timing diagram of a variation in voltage of the first memory block under the voltage conditions of FIG. 9.

FIG. 10 is a timing diagram showing a variation in voltage of the memory block BLK1 under the voltage conditions of FIG. 9.

Referring to FIGS. 4, 5, 9, and 10, a precharge operation may be performed at the first time point t1. Specifically, a precharge voltage Vpre may be applied to bit lines BL1 to BL3. A developing operation may be performed at a second time point t2, and the bit lines BL1 to BL3 that are charged with the precharge voltage Vpre may be floated.

A second string selection line voltage Vssl2 may be applied to a selected string selection line (e.g. SSL1). Thus, string selection transistors corresponding to the selected string selection line SSL1 may be turned on. Accordingly, the strings NS11 to NS13 of the first row may be electrically connected to the bit lines BL1 to BL3.

A third string selection line voltage Vssl3 may be applied to unselected string selection lines (e.g., SSL2 and SSL3). Thus, string selection transistors connected to the unselected string selection lines SSL2 and SSL3 may be turned off. Accordingly, the strings NS21 to NS23 and NS31 to NS33 of the second and third rows may be electrically isolated from the bit lines BL1 to BL3.

An erase verification voltage Vvfy may be applied to the word lines WL1 to WL8. Thus, memory cells having a higher threshold voltage than the erase verification voltage Vvfy from among memory cells MC1 to MC8 of the strings NS11 to NS13 of the first row may be turned off, and memory cells having a lower threshold voltage than the erase verification voltage Vvfy from among the memory cells MC1 to MC8 of the strings NS11 to NS13 of the first row may be turned on.

A second ground selection line voltage Vgsl2 may be applied to the ground selection line GSL. Thus, the ground selection transistors GST and strings NS11 to NS13, NS21 to NS23, and NS31 to NS33 may be electrically connected to the common source line CSL, which has a voltage Vcsl.

When all the memory cells MC1 to MC8 of a specific string of the strings NS11 to NS13 of the first row are turned on, a channel may be formed between the corresponding bit line BL and the common source line CSL. Accordingly, current may flow from the corresponding bit line BL into the common source line CSL, and a voltage of the corresponding bit line BL may be lowered from a precharge voltage Vpre.

When at least one of the memory cells MC1 to MC8 of a specific string of the strings NS11 to NS13 of the first row are turned off, a channel may not be formed between the corresponding bit line BL and the common source line CSL. Accordingly, current may not flow from the corresponding bit line BL into the common source line CSL, and a voltage of the corresponding bit line BL may be maintained at the precharge voltage Vpre.

Data may be latched at a third time point t3, and an erase pass or an erase failure may be determined according to voltages of the bit lines BL1 to BL3. For example, when the voltages of the first to third bit lines BL1 to BL3 are lower than the precharge voltage Vpre, that is, when threshold voltages of the memory cells MC1 to MC8 of a selected row of the memory block BLK1 are lower than the erase verification voltage Vvfy, the erase pass may be determined. Meanwhile, when a voltage of at least one of the first to third bit lines BL1 to BL3 is the precharge voltage Vpre, that is, when a threshold voltage of at least one of the memory cells MC1 to MC8 of the selected first row of the memory block BLK1 is higher than the erase verification voltage Vvfy, the erase failure may be determined.

According to the present exemplary embodiment, when an erase fail is detected from at least one of the strings NS11 to NS13 of the first row connected to the first string selection line SSL1, an erase operation may be performed again. When the strings NS11 to NS13 of the first row are erase-passed, the next string selection line (e.g., SSL2) is selected and an erase verification operation may be performed on the memory cells MC1 to MC8 of the strings NS21 to NS23 connected to the selected string selection line SSL2.

Referring back to FIG. 6, in operation S150, fail column information may be stored for a fail string, which is erase-failed, from among strings connected to one string selection line. For example, as a result of an erase verification operation on the strings NS11, NS12, and NS13 of the first row connected to the first string selection line SSL1, some strings (e.g., NS12 and NS13) may be determined as erase-passed, while other strings (e.g., NS11) may be determined as erase-failed.

In the related art, an erase verification operation is performed in units of string selection lines, and it is determined only whether each of the string selection lines is erase-passed or erase-failed based on an erase verification result. However, according to the present exemplary embodiment, an erase verification operation may be performed in units of string selection lines, and fail column information corresponding to an erase-failed string (e.g., a fail string NS11) may be additionally stored as an erase verification result.

In the present exemplary embodiment, fail column information may include the number of fail strings and locations of the fail strings. Specifically, as a result of an erase verification operation in units of string selection lines, the number of the fail strings may be stored in a column corresponding to each bit line. In an exemplary embodiment, the number of fail strings in each column may be additionally stored for each string selection line. In another exemplary embodiment, the number of the fail strings in each column may be accumulated and stored for the plurality of string selection lines.

In operation S170, an erase-pass/fail result may be stored in units of string selection lines. Specifically, it may be determined whether each of the string selection lines may be erase-passed or erase-failed based on the fail column information, and the determined erase-pass/fail result may be stored. For example, as a result of an erase verification operation on the first string selection line SSL1, when the number of fail strings is equal to or higher than a critical number, the strings NS11, NS12, and NS13 connected to the first string selection line SSL1 are determined as erase-failed, and an erase fail result for the first string selection line SSL1 may be stored. Meanwhile, when the number of the fail strings is less than the critical number, the strings NS11, NS12, and NS13 connected to the first string selection line SSL1 may be determined as erase-passed, and an erase-pass result for the first string selection line SSL1 may be stored.

According to the present exemplary embodiment as described above, an erase verification operation may be performed in units of string selection lines, fail column information corresponding to a fail string may be stored for each string selection line based on an erase verification result, and an erase-pass/fail result may be stored for each string selection line. By storing the fail column information corresponding to the fail string in each of the string selection lines, an erase-failed memory block may be detected more minutely, a defect processing operation may be performed on each of the string selection lines, and a program failure may be prevented by inhibiting a program operation on a fail column, as described in detail later.

Figure 11:
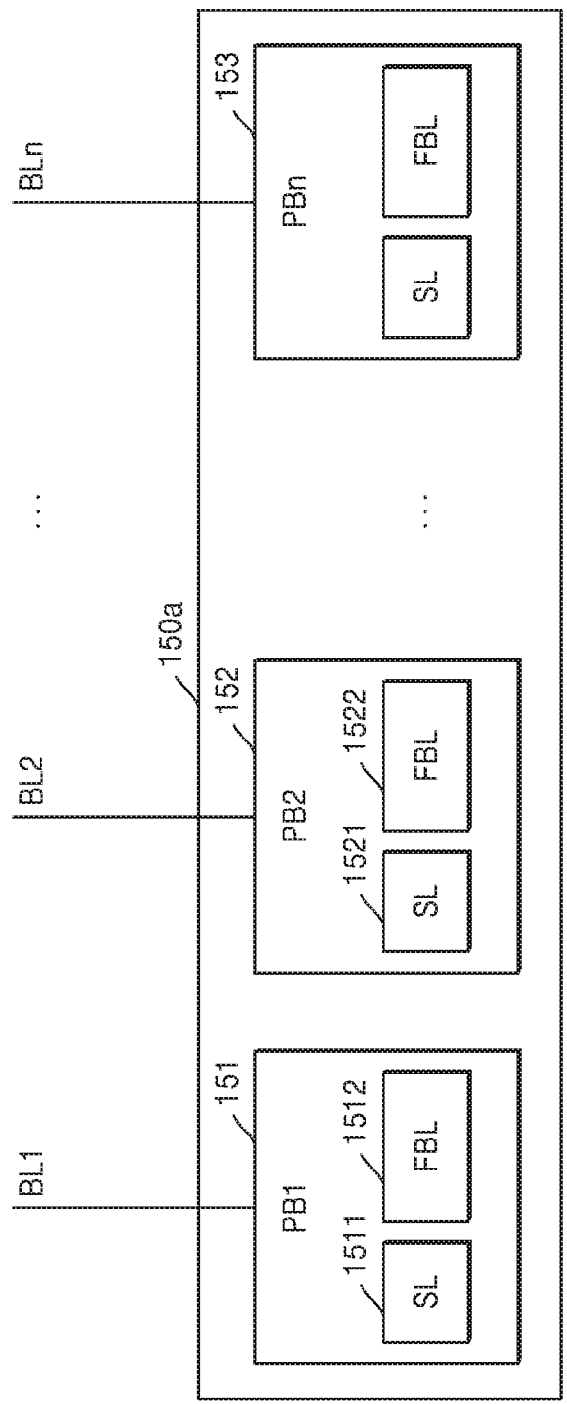
FIG. 11 is a block diagram of a write/read circuit included in the memory device of FIG. 2, according to an exemplary embodiment.

FIG. 11 is a block diagram of a write/read circuit included in the memory device of FIG. 2, according to an exemplary embodiment.

Referring to FIGS. 2 and 11, the write/read circuit 150a may include a plurality of page buffers PB1 151, PB2 152, and PBn 153 corresponding respectively to a plurality of bit lines BL1 to BLn. In other words, each of the bit lines BL1 to BLn may correspond to one page buffer. However, the disclosure is not limited thereto. In another exemplary embodiment, at least two bit lines may correspond to one page buffer.

When an erase verification operation is performed on memory cells included in the memory cell array 110, the plurality of page buffers 151, 152, and 153 may store sensed data as a result of the erase verification operation. In the present exemplary embodiment, each of the page buffers 151, 152, and 153 may include a sense latch SL and a fail bit latch FBL. More specifically, page buffer PB1 151 includes a sense latch SL 1511 and a fail bit latch FBL 1512, page buffer PB2 152 includes a sense latch SL 1521 and a fail bit latch FBL 1522, etc.

The sense latch SL may store sensed data due to the erase verification operation on each of string selection lines. For example, the sense latch SL may store a voltage of a bit line (i.e., a value corresponding to a voltage of a bit line at a third time point t3 of FIG. 9). Also, the sense latch SL may provide the sensed data to the pass/fail check unit 160 and the fail bit latch FBL.

As a result of the erase verification operation performed on each of the string selection lines, some of the plurality of strings may be determined as erase-failed, and data stored in the sense latch SL corresponding to the erase-failed strings may be erase-failed. In this case, data stored in the sense latch SL may correspond to fail bits. The fail bit latch FBL may accumulate and store the fail bits, which are generated as a result of the erase verification operation performed on each of the string selection lines, in the plurality of string selection lines.

For example, as a result of the erase verification operation on the strings NS11, NS12, and NS13 connected to the first string selection line SSL1, the string NS11 may be determined as erase-failed, and the strings NS12 and NS13 may be determined as erase-passed. In this case, data stored in a sense latch 1511 corresponding to the bit line BL1 connected to the string NS11 may correspond to fail bits, and a fail bit latch 1512 may count the fail bits stored in the sense latch 1511 and store data of '1' indicating the count of fail bits. Meanwhile, data stored in the sense latch 1521 corresponding to the bit line BL2 connected to the string NS12 may correspond to pass bits, and a fail bit latch 1522 may store data '0'.

Thereafter, as a result of the erase verification operation on the strings NS21, NS22, and NS23 connected to the second string selection line SSL2 may be performed. The strings NS21 and NS22 may be determined as erase-failed, and the string NS23 may be determined as erase-passed. In this case, data stored in the sense latch 1511 corresponding to the bit line BL1 connected to the string NS21 may correspond to fail bits, and the fail bit latch 1512 may accumulatively count the fail bits stored in the sense latch 1511 and store data '2'. Meanwhile, data stored in the sense latch 1521 corresponding to the bit line BL2 connected to the string NS22 may correspond to fail bits, and the fail bit latch 1522 may accumulatively count the fail bits stored in the sense latch 1522 and store data '1'.

Figure 12:
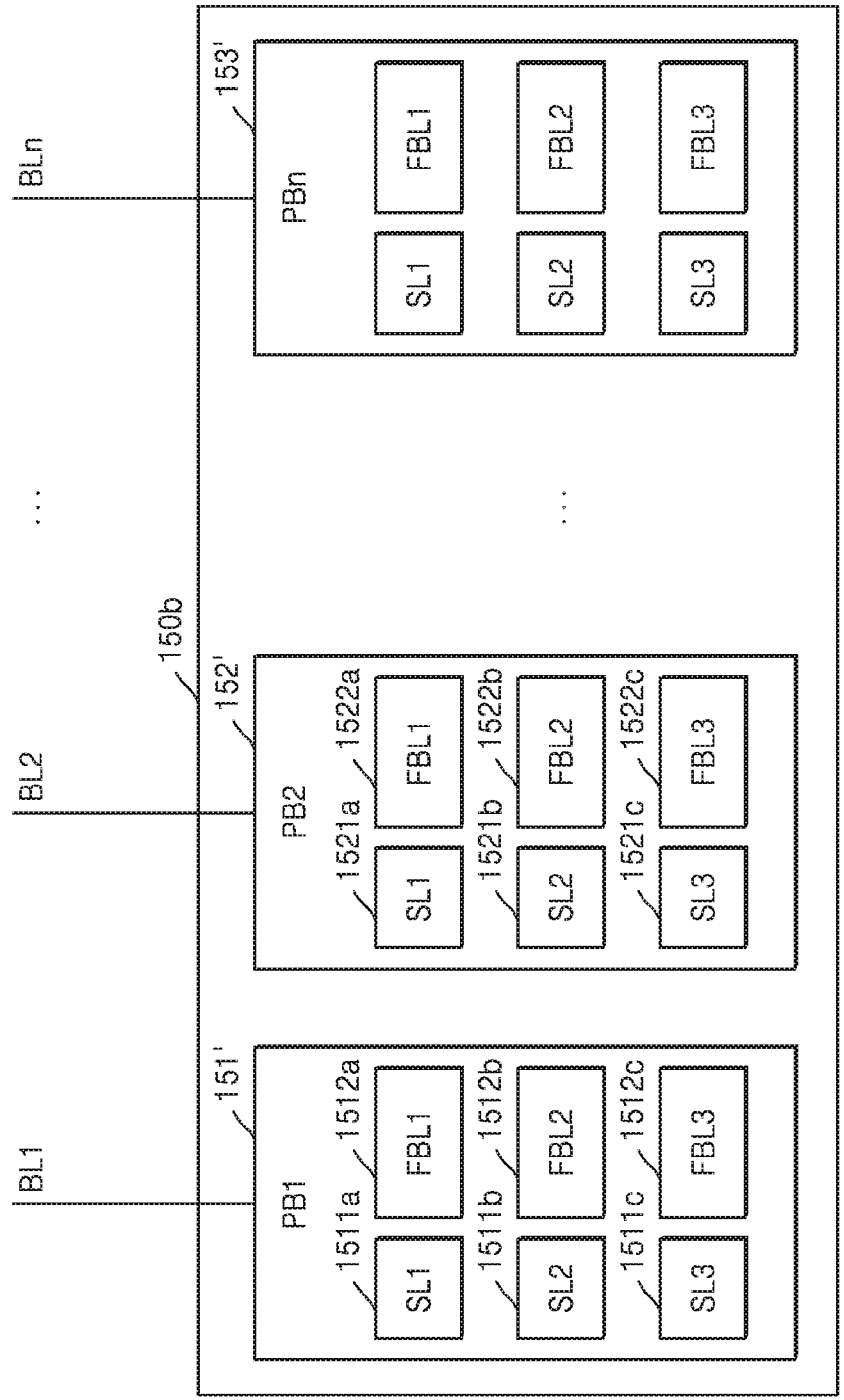
FIG. 12 is a block diagram of a write/read circuit included in the memory device of FIG. 2, according to another exemplary embodiment.

FIG. 12 is a block diagram of a write/read circuit 150b included in the memory device of FIG. 2, according to another exemplary embodiment.

Referring to FIGS. 2 and 12, the write/read circuit 150b may include a plurality of page buffers PB1 151', PB2 152', and PBn 153' corresponding respectively to a plurality of bit lines BL1 to BLn. In other words, each of the bit lines BL1 to BLn may correspond to one page buffer. However, the disclosure is not limited thereto. In another exemplary embodiment, at least two bit lines may correspond to one page buffer. The write/read circuit 150b according to the present exemplary embodiment may be a modified example of the write/read circuit 150a of FIG. 11. Detailed descriptions presented with reference to FIG. 11 may be applied to the present exemplary embodiment, and repeated descriptions will be omitted.

When an erase verification operation is performed on memory cells included in the memory cell array 110, a plurality of page buffers 151', 152', and 153' may store sensed data as a result of the erase verification operation. In the present exemplary embodiment, each of the plurality of page buffers 151', 152', and 153' may include a plurality of sense latches SL1 to SL3 and a plurality of fail bit latches FBL1 to FBL3. Specifically, each of the page buffers 151', 152', and 153' may include a plurality of sense latches SL1 to SL3 and a plurality of fail bit latches FBL1 to FBL3, which respectively correspond to a plurality of string selection lines.

Each of the plurality of sense latches SL1 to SL3 may store sensed data due to the erase verification operation on the plurality of string selection lines. For example, the first sense latch SL1 may store sensed data due to the erase verification operation on the first string selection line SSL1, the second sense latch SL2 may store sensed data due to the erase verification operation on the second string selection line SSL2, and the third sense latch SL3 may store sensed data due to the erase verification operation on the third string selection line SSL3.

When data stored in the plurality of sense latches SL1 to SL3 corresponding respectively to the plurality of fail bit latches FBL1 to FBL3 are erase-failed, the plurality of fail bit latches FBL1 to FBL3 may store generated fail bits. The fail bit latches FBL1 to FBL3 may correspond one-to-one to the sense latches SL1 to SL3.

For example, as a result of an erase verification operation on the strings NS11, NS12, and NS13 connected to the first string selection line SSL1, the string NS11 may be determined as erase-failed, while the strings NS12 and NS13 may be determined as erase-passed. In this case, data stored in a first sense latch 1511a corresponding to the bit line BL1 connected to the string NS11 may correspond to fail bits, and a first fail bit latch 1512a may count the fail bits stored in the first sense latch 1511a and store data '1'. Meanwhile, data stored in a first sense latch 1521a corresponding to the bit line BL2 connected to the string NS12 may correspond to pass bits, and the first fail bit latch 1522a may store data '0'.

Thereafter, as a result of an erase verification operation on the strings NS21, NS22, and NS23 connected to the second string selection line SSL2, the strings NS21 and NS22 may be determined as erase-failed, while the string NS23 may be determined as erase-passed. In this case, data stored in a second sense latch 1511b corresponding to the bit line BL1 connected to the string NS21 may correspond to fail bits, and the second fail bit latch 1512b may count the fail bits stored in the second sense latch 1511b and store data '1'. Meanwhile, data stored in the second sense latch 1521b corresponding to the bit line BL2 connected to the string NS22 may correspond to fail bits, and the second fail bit latch 1522b may store data '1'. A third sense latch 1511c and a third fail bit latch 1512c attached to bit line BL1 and a third sense latch 1521c and a third fail bit latch 1522c attached to bit line BL2 operate similarly to the above-described second sense latch 1511b and second fail bit latch 1512b attached to bit line BL1 and second sense latch 1521b and third fail bit latch 1522c attached to bit line BL2, respectively.

Figure 13:
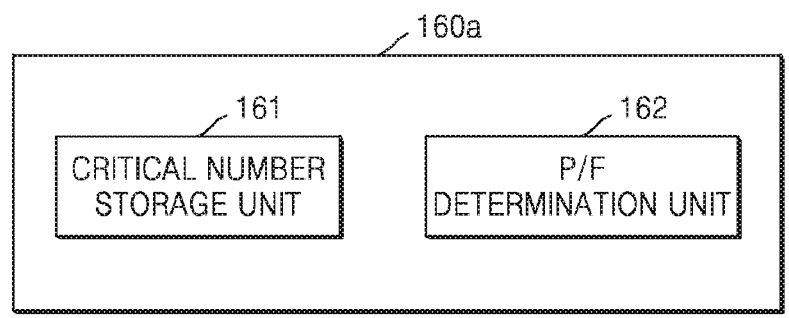
FIG. 13 is a block diagram of a pass/fail check unit included in the memory device of FIG. 2, according to an exemplary embodiment.

FIG. 13 is a block diagram of a pass/fail check unit 160a included in the memory device of FIG. 2, according to an exemplary embodiment.

Referring to FIG. 13, the pass/fail check unit 160a may include a critical number storage unit 161 and a pass/fail determination unit 162. The critical number storage unit 161 may store a first critical number by which it is determined whether each of the string selection lines is erase-passed or erase-failed. The first critical number may be a predetermined number and may be differently determined according to a memory block.

The pass/fail determination unit 162 may receive sensed data as a result of an erase verification operation, compare the received data with the first critical number, and determine whether each of the string selection lines is erase-passed or erase-failed. Specifically, the pass/fail determination unit 162 may receive sensed data from a sense latch (e.g., SL of FIG. 11 or SL1 to SL3 of FIG. 12) included in the write/read circuit 150. Thereafter, the pass/fail determination unit 162 may compare the first critical number stored in the critical number storage unit 161 with the sensed data, and determine whether each of the string selection lines is erase-passed or erase-failed. Thereafter, the pass/fail determination unit 162 may provide a pass signal or fail signal P/F to the erase control unit 121 of the control logic unit 120 based on the determination result. Detailed operations of the pass/fail check unit 160a will be described in further detail with reference to FIG. 14.

FIG. 14 is a table showing the number of fail strings for each string selection line, according to an exemplary embodiment.

Referring to FIG. 14, an example in which a memory block (e.g., BLK1 in FIG. 5) includes four string selection lines SSL1 to SSL4 will be described. As a result of an erase verification operation on a first string selection line SSL1, the number of fail columns corresponding to a fail string may be determined as 1. As a result of an erase verification operation on a second string selection line SSL2, the number of fail columns corresponding to a fail string may be determined as 20. As a result of an erase verification operation on a third string selection line SSL3, the number of fail columns corresponding to a fail string may be determined as 0. As a result of an erase verification operation on a fourth string selection line SSL4, the number of fail columns corresponding to a fail string may be determined as 2.

Referring to FIGS. 13 and 14, the critical number storage unit 161 may store, for example, 5 as a first critical number by which it is determined whether each of the string selection lines is erase-passed or erase-failed. Since the number of fail columns of the first string selection line SSL1 is 1 and less than the first critical number, strings connected to the first string selection line SSL1 may be determined as erase-passed. Since the number of fail columns of the second string selection line SSL2 is 20 and more than the first critical number, strings connected to the second string selection line SSL2 may be determined as erase failed. Since the number of fail columns of the third string selection line SSL3 is 0 and less than the first critical number, strings connected to the first string selection line SSL1 may be determined as erase-passed. Since the number of fail columns of the fourth string selection line SSL4 is 2 and less than the first critical number, strings connected to the fourth string selection line SSL4 may be determined as erase-passed.

According to the related art, when even one string was determined as erase-failed as a result of an erase verification operation performed on each of string selection lines, strings connected to the corresponding string selection line were determined as erase-failed. However, according to the present exemplary embodiment, when a first critical number of strings or more are determined as erase-failed as a result of an erase verification operation performed on each of string selection lines, strings connected to the corresponding string selection line may be determined as erase-failed.

Figure 15:
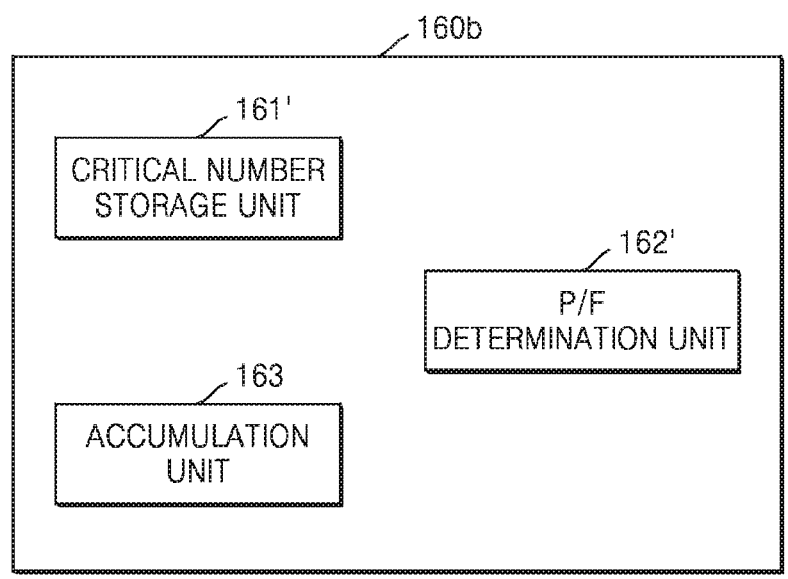
FIG. 15 is a block diagram of a pass/fail check unit included in the memory device of FIG. 2, according to another exemplary embodiment.

FIG. 15 is a block diagram of a pass/fail check unit 160b included in the memory device of FIG. 2, according to another exemplary embodiment.

Referring to FIG. 15, the pass/fail check unit 160b may include a critical number storage unit 161', an accumulation unit 163, and a pass/fail determination unit 162'. The critical number storage unit 161' may store a second critical number by which it is determined whether each of memory blocks is erase-passed or erase-failed. The second critical number may be a predetermined value or differently determined according to each memory block. For example, the second critical number may be 20.

The accumulation unit 163 may accumulate and store the number of fail columns for each string selection line. Specifically, the accumulation unit 163 may receive sensed data from a sense latch (e.g., SL of FIG. 11 or SL1 to SL3 of FIG. 12) included in the write/read circuit 150, and accumulate and store the number of fail columns for each string selection line based on the received data. For example, in the case of FIG. 14, the accumulation unit 163 may accumulate the numbers of fail columns in first to fourth string selection lines and store 23 as the number of all fail columns corresponding to a memory block.

The pass/fail determination unit 162' may compare the second critical number stored in the critical number storage unit 161' with the number of all the fail columns stored in the accumulation unit 163, and determine whether each of the memory blocks is erase-passed or erase-failed. Thereafter, the pass/fail determination unit 162' may provide a pass signal or fail signal P/F to the erase control unit 121 included in the control logic unit 120 based on the determination result. For example, when the second critical number is 20, the number of all the fail columns is 23 in the case of FIG. 14. Thus, the memory block may be determined as erase-failed.

Figure 16:
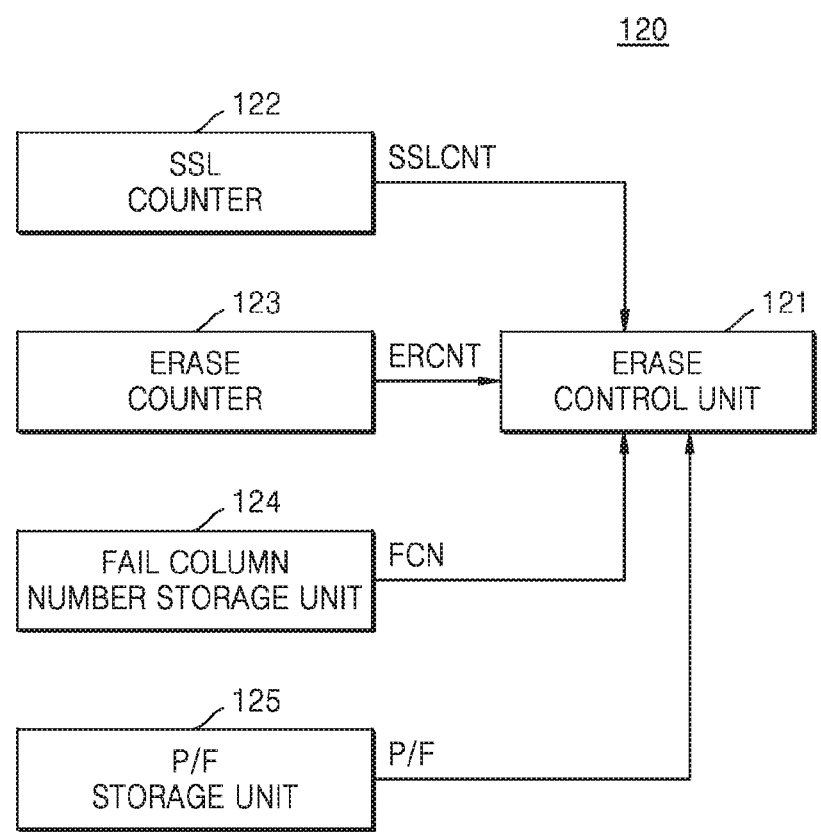
FIG. 16 is a block diagram of a control logic unit included in the memory device of FIG. 2, according to an exemplary embodiment.

FIG. 16 is a block diagram of a control logic unit 120 included in the memory device of FIG. 2, according to an exemplary embodiment.

Referring to FIG. 16, the control logic unit 120 may include an erase control unit 121, a string selection line counter 122, an erase counter 123, a fail column number storage unit 124, and a pass/fail storage unit 125.

The string selection line counter 122 may output a count value (i.e., a string selection line count SSLCNT) corresponding to addresses of the string selection line SSL. For example, the string selection line count SSLCNT may correspond to addresses of first to third string selection lines SSL1 to SSL3 of the first memory block (refer to BLK1 in FIG. 5). Specifically, the string selection line counter 122 may count up or count down so that the string selection line corresponding to the string selection line count SSLCNT may be changed.

The erase counter 123 may output a count value (i.e., an erase count ERCNT) corresponding to the number of erase operations performed on a specific memory block of the memory cell array 110. For example, the erase count ERCNT may correspond to the number of times an erase voltage is applied to the specific memory block during an erase operation. Specifically, the erase count ERCNT may correspond to the number of times an erase voltage (or an erase pulse) is applied to the specific memory block during an incremental step pulse erase (ISPE) operation.

The fail column number storage unit 124 may store the number of fail columns for each string selection line SSL. In an exemplary embodiment, the fail column number storage unit 124 may accumulate the number of fail columns for a plurality of string selection lines and store the number of all fail strings. In another exemplary embodiment, the fail column number storage unit 124 may include latches respectively corresponding to the plurality of string selection lines, and each of the latches may store the number of fail columns for each string selection line. The fail column number storage unit 124 outputs the number of fail strings as a count FCN to the erase control unit 121.

The pass/fail storage unit 125 may store a pass/fail signal P/F received from the pass/fail check unit 160. In an exemplary embodiment, the pass/fail storage unit 125 may include one latch corresponding to a plurality of string selection lines. In another exemplary embodiment, the pass/fail storage unit 125 may include latches corresponding respectively to the plurality of string selection lines. The pass/fail storage unit outputs the pass/fail signal P/F to the erase control unit 121.

The erase control unit 121 may determine whether an erase operation or an erase verification operation is to be performed in response to the pass/fail signal P/F. When a fail signal is stored in the pass/fail storage unit 125, the erase control unit 121 may control the voltage generation unit 130, the row decoder 140, and the write/read circuit 150 to erase a selected memory block of the memory cell array 110. Meanwhile, when a pass signal is stored in the pass/fail storage unit 125, the erase control unit 121 may control the voltage generation unit 130, the row decoder 140, and the write/read circuit 150 to erase-verify strings connected to the next string selection line of the selected memory block of the memory cell array 110.

Specifically, the erase control unit 121 may control an erase operation based on the erase count ERCNT output by the erase counter 123. For example, as the erase count ERCNT increases, the erase control unit 121 may control the voltage generation unit 130 to output a higher voltage. Also, the erase control unit 121 may control the erase verification operation based on the string selection line count SSLCNT output by the string selection line counter 122. For example, as the string selection line count SSLCNT increases, the erase control unit 121 may control the row decoder 140 to select the corresponding string selection line.

Figure 17:
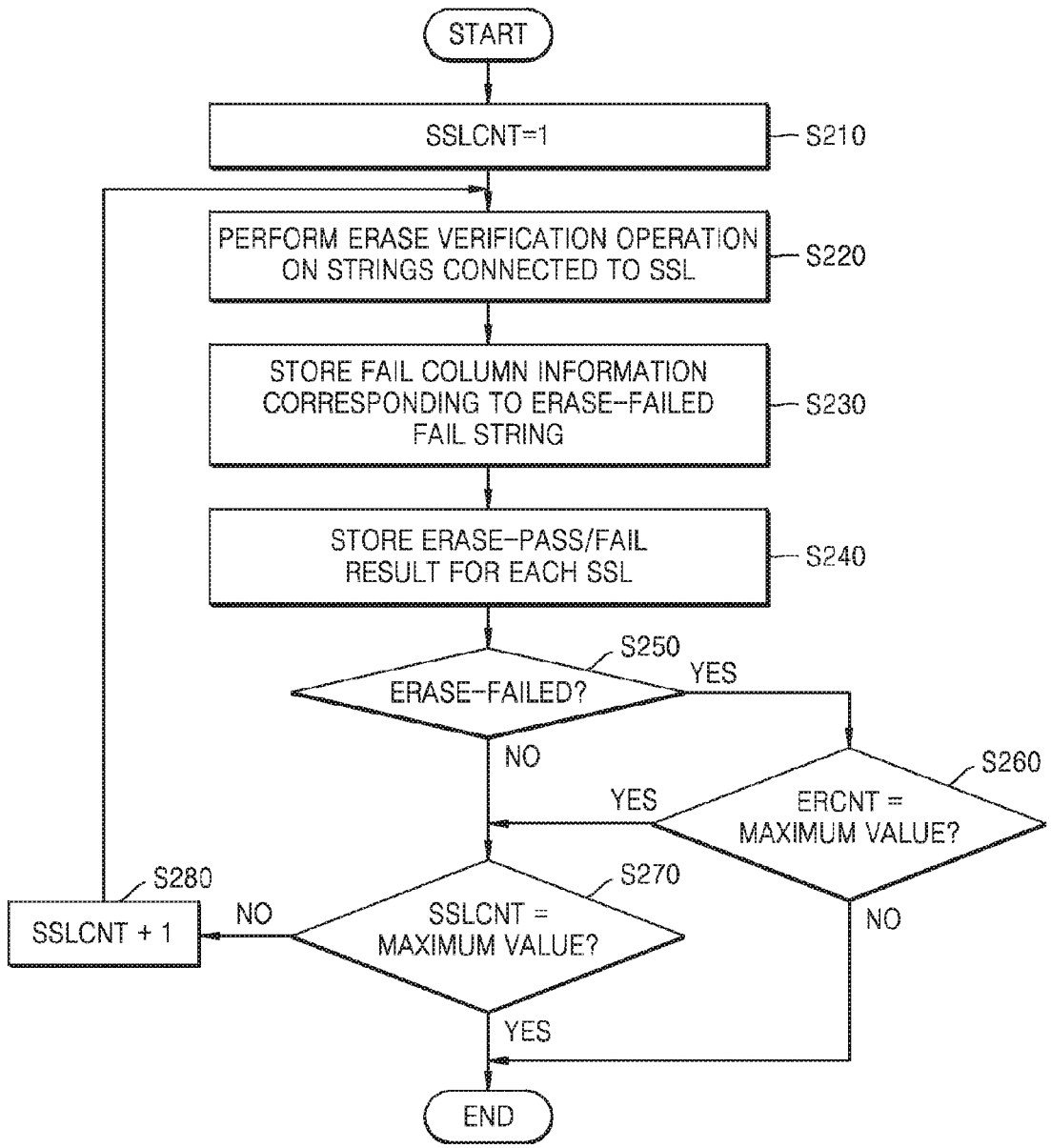
FIG. 17 is a detailed flowchart of an erase verification method of a memory device according to an exemplary embodiment.

FIG. 17 is a detailed flowchart of an erase verification method of a memory device according to an exemplary embodiment.

Referring to FIG. 17, the erase verification method of the memory device according to the present exemplary embodiment may be performed on each of the string selection lines after an erase operation is performed on memory cells. Specifically, the erase verification method of the memory device according to the present exemplary embodiment may include specific operations of operations S130 and S150 of FIG. 6. Detailed descriptions presented with reference to FIGS. 1 to 16 may be applied to the present exemplary embodiment.

In operation S210, a string selection line count SSLCNT may be 1. In operation S220, an erase verification operation may be performed on strings connected to a string selection line SSL. For example, when the string selection line count SSLCNT output by the string selection line counter 122 is 1, the erase control unit 121 may control the voltage generation unit 130, the row decoder 140, and the write/read circuit 150 to perform an erase verification operation on a first string selection line SSL1.

In operation S230, fail column information corresponding to an erase-failed fail string, from strings connected to a selected string selection line SSL, may be stored. For example, a fail bit latch (e.g., 1512 in FIG. 11) connected to a fail string (e.g., NS11), which has been erase-failed, from among the strings NS11, NS12, and NS13 connected to the first string selection line SSL1, may store a fail bit.

In operation S240, an erase-pass/fail result may be stored for each string selection line SSL. For example, the pass/fail check unit 160 may determine whether each of string selection lines SL1 through SL4 is erase-passed or erase-failed by comparing the number of fail columns for each string selection line SSL with a first critical number, and provide a determination result to the control logic unit 120. Thereafter, the pass/fail storage unit 125 included in the control logic unit 120 may store the erase-pass/fail result for each string selection line SSL.

In operation S250, it may be determined whether the selected string selection line is erase-failed. If the selected string selection line is determined as erase-failed, operation S260 may be performed. If the selected string selection line is determined as erase-passed, operation S270 may be performed. For example, the erase control unit 121 may determine whether the first string selection line is erase-passed or erase-failed based on a pass/fail signal.

In operation S260, it may be determined whether an erase count ERCNT is a maximum value. If the erase count ERCNT is determined as a maximum value, operation S270 may be performed; otherwise, the erase verification operation may be ended, and the erase count ERCNT may be counted up so that an erase operation may be performed on the memory block again.

In operation S270, it may be determined whether the string selection line count SSLCNT is a maximum value. If the string selection line count SSLCNT is determined as the maximum value, the erase verification operation may be ended; otherwise, operation S280 may be performed. For example, the erase control unit 121 may determine whether the string selection line count SSLCNT received from the string selection line counter 122 is a maximum value (e.g., 4).

In operation S280, the string selection line count SSLCNT may be incremented. For example, the string selection line counter 122 may increment the string selection line count SSLCNT and output 2 as the string selection line count SSLCNT. Thus, operation S220 may be performed, and the erase control unit 121 may control the voltage generation unit 130, the row decoder 140, and the write/read circuit 150 to perform an erase verification operation on the second string selection line SSL2.

Figure 18:
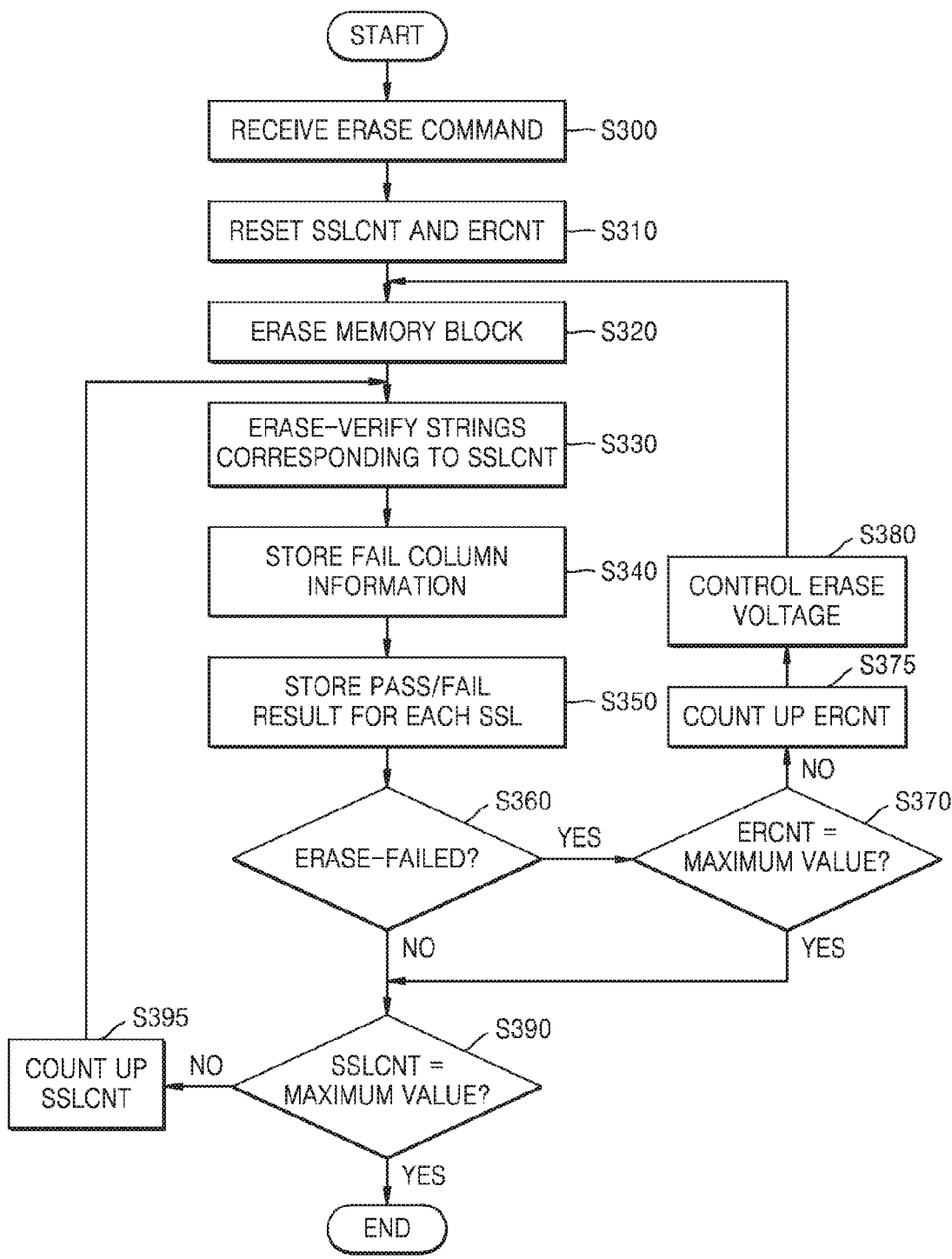
FIG. 18 is a detailed flowchart of a method of operating a memory device according to an exemplary embodiment.

FIG. 18 is a detailed flowchart of a method of operating a memory device according to an exemplary embodiment.

Referring to FIG. 18, the method of operating the memory device according to the present exemplary embodiment may be a method of performing an erase operation and an erase verification operation on a plurality of memory cells included in a memory cell array, and may include detailed operations of the method of FIG. 6. Detailed descriptions presented with reference to FIGS. 1 to 17 may be applied to the method of operating the memory device according to the present exemplary embodiment.

In operation S300, an erase command may be received. For example, a control logic unit 120 of a memory device 100 may receive an erase command and an address from the memory controller 200. The received address may correspond to at least two string selection lines.

In operation S310, a string selection line count SSLCNT and an erase count ERCNT may be reset. For example, the erase control unit 121 may reset a string selection line counter 122 and an erase counter 123 to reset the string selection line count SSLCNT and the erase count ERCNT. For example, the reset string selection line count SSLCNT may be a first string selection line (e.g., SSL1) of a memory block (e.g., BLK1) corresponding to the received address. For example, the reset erase count ERCNT may have a logic value '1'.

In operation S320, memory cells corresponding to the received address, for example, the memory block, may be erased. In operation S330, strings corresponding to the string selection line count SSLCNT may be erase-verified. For example, when the string selection line count SSLCNT indicates the first string selection line SSL1, memory cells of strings NS11, NS12, and NS13 of a first row corresponding to the first string selection line SSL1 may be erase-verified.

In operation S340, fail column information corresponding to an erase-failed fail string, from among the plurality of strings corresponding to a selected string selection line, may be stored. In operation S350, an erase-pass/fail result may be stored for each string selection line. In operation S360, it may be determined whether a selected string selection line is erase-failed. If the selected string selection line is determined as erase-failed, operation S370 may be performed. If the selected string selection line is determined as erase-passed, operation S390 may be performed.

In operation S370, a determination is made whether an erase count ERCNT has reached a maximum value. If the erase count ERCNT is determined as the maximum value, operation S390 may be performed; otherwise, operation S375 may be performed. In operation S375, the erase count ERCNT may be incremented. For example, the erase counter 123 may increment the erase count ERCNT and output 2 as the erase count ERCNT.

In operation S380, an erase voltage may be controlled according to the erase count ERCNT. For example, when the erase control unit 121 receives 2 as the erase count ERCNT, the voltage generation unit 130, the row decoder 140, and the write/read circuit 150 may be controlled to perform a second erase loop on the memory cells. In this case, the erase control unit 121 may generate a voltage control signal CTRL_vol such that the erase voltage further rises with an increase in the erase count ERCNT, and may provide the generated voltage control signal CTRL_vol to the voltage generation unit 130.

In operation S390, it may be determined whether the string selection line count SSLCNT is a maximum value. If the string selection line count SSLCNT is determined as the maximum value, the erase operation may be ended; otherwise, operation S395 may be performed. For example, the erase control unit 121 may determine whether the string selection line count SSLCNT received from the string selection line counter 122 is a maximum value (e.g., 4).

In operation S395, the string selection line count SSLCNT may be incremented. For example, the string selection line counter 122 may increment the string selection line count SSLCNT and output 2 as the string selection line count SSLCNT. Thus, operation S330 may be performed again, and the erase control unit 121 may control the voltage generation unit 130, the row decoder 140, and the write/read circuit 150 to perform an erase verification operation on the second string selection line SSL2.

Figure 19:
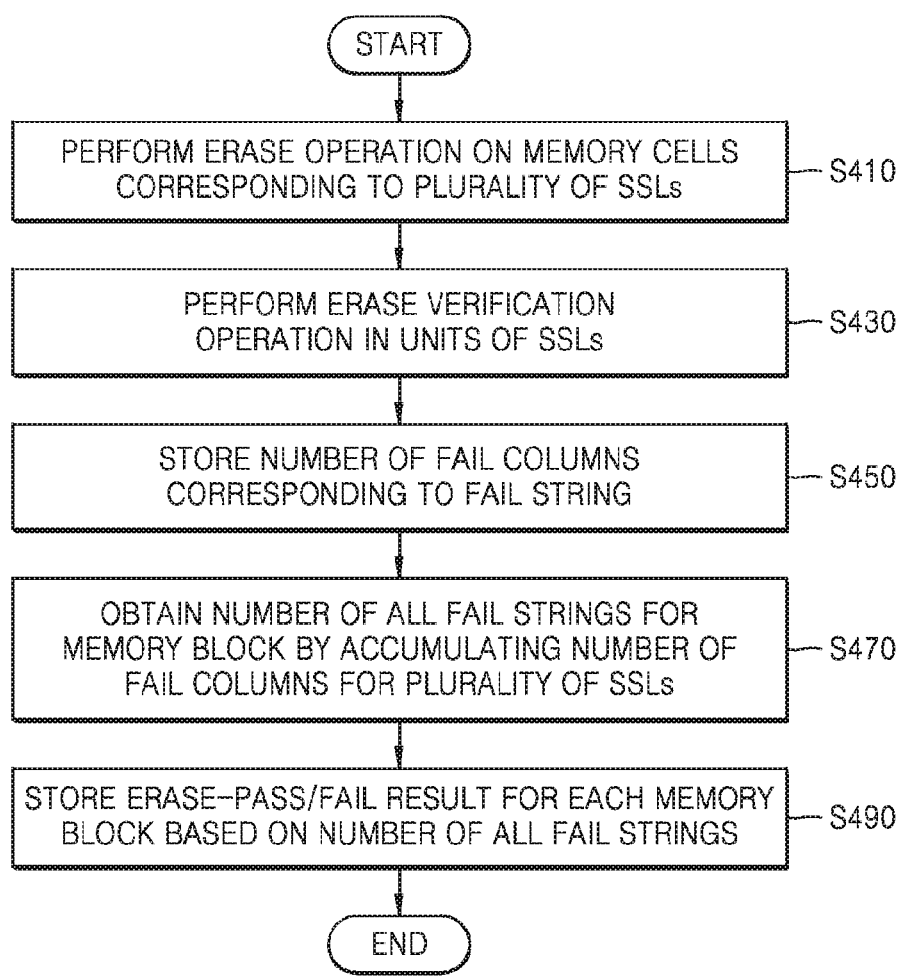
FIG. 19 is a flowchart of a method of operating a memory device according to another exemplary embodiment.

FIG. 19 is a flowchart of a method of operating a memory device according to another exemplary embodiment.

Referring to FIG. 19, the method of operating the memory device according to the present exemplary embodiment may be a method of performing an erase operation and an erase verification operation on a plurality of memory cells included in a memory cell array. Detailed descriptions presented with reference to FIGS. 1 to 18 may be applied to the method of operating the memory device according to the present exemplary embodiment.

In operation S410, an erase operation may be performed on memory cells corresponding to a plurality of string selection lines. In operation S430, an erase verification operation may be performed in units of string selection lines. In operation S450, fail column information corresponding to an erase-failed fail string, from among strings connected to one string selection line, may be stored.

In operation S470, the number of all fail strings in the memory block may be obtained by accumulating the number of fail columns for the plurality of string selection lines. In an exemplary embodiment, the fail bit latch (refer to FBL in FIG. 11) may accumulate the number of fail columns for each string selection line and store the number of all fail strings in the memory block including the plurality of string selection lines. In another exemplary embodiment, the accumulation unit (refer to 163 in FIG. 15) may accumulate the number of fail columns for each string selection line and store the number of all fail strings in the memory block including the plurality of string selection lines.

In operation S490, an erase-pass/fail result may be stored for each memory block based on the number of all fail strings. Specifically, it may be determined whether each of memory blocks is erase-passed or erase-failed based on the number of all the fail strings, and the determined erase-pass/fail results may be stored. In the example of FIG. 14, the number of all the fail strings may be 23. When a second critical number of the memory block, which is stored in the critical number storage unit (e.g., 161' in FIG. 15) is 20, the number (i.e., 23) of all the fail strings may be more than the second critical number. Thus, the memory block may be determined as erase-failed, and an erase fail result for the memory block may be stored.

According to the present exemplary embodiment as described above, an erase verification operation may be performed in units of string selection lines, and fail column information corresponding to fail strings may be accumulated and stored for each string selection line based on the erase verification result so that an erase-pass/fail result may be stored for each memory block including a plurality of string selection lines. Thus, in the example of FIG. 14, strings connected to the second string selection line SSL2 may neither be determined as erase-failed nor processed as bad string selection lines; however, the entire memory block may be determined as erase-failed and processed as a bad block.

Figure 20:
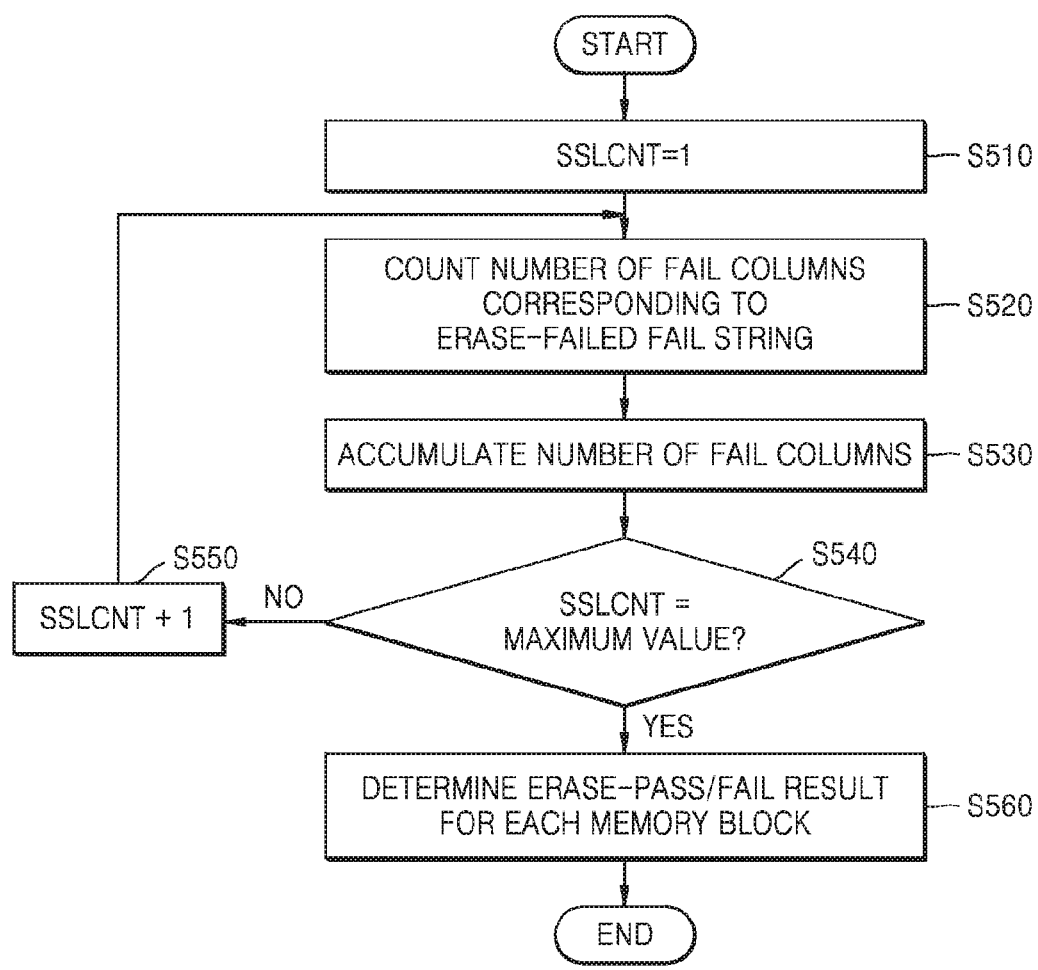
FIG. 20 is a detailed flowchart of a method of operating a memory device according to another exemplary embodiment.

FIG. 20 is a detailed flowchart of a method of operating a memory device according to another exemplary embodiment.

Referring to FIG. 20, the method of operating the memory device according to the present exemplary embodiment may include detailed operations of an example of the method of FIG. 19. Specifically, the method of operating the memory device according to the present exemplary embodiment may be a method of checking whether a memory block is erase-passed or erase-failed by accumulating the number of fail columns for each string selection line, and may correspond to examples of operations S470 and S490 of FIG. 19. Detailed descriptions presented with reference to FIGS. 1 to 19 may be applied to the present exemplary embodiment.

In operation S510, a string selection line count SSLCNT may be 1. In operation S520, the number of fail columns corresponding to a fail string, which is erase-failed, may be counted. In operation S530, the number of fail columns may be accumulated. For example, the accumulation unit (refer to 163 in FIG. 5) may accumulate the number of fail columns in a plurality of string selection lines.

In operation S540, it may be determined whether the string selection line count SSLCNT is a maximum value. If the string selection line count SSLCNT is determined as the maximum value, operation S560 may be performed; otherwise, operation S550 may be performed. For example, the erase control unit 121 may determine whether the string selection line count SSLCNT received from the string selection line counter 122 is a maximum value (e.g., 4).

In operation S550, the string selection line count SSLCNT may be incremented. For example, the string selection line counter 122 may increment the string selection line count SSLCNT and output 2 as the string selection line count SSLCNT. Thus, operation S520 may be performed again, and the erase control unit 121 may control the voltage generation unit 130, the row decoder 140, and the write/read circuit 150 to perform an erase verification operation on the second string selection line SSL2.

In operation S560, it may be determined whether each of the memory blocks is erase-passed or erase-failed. Specifically, the pass/fail determination unit (refer to 162' in FIG. 15) may determine whether each of the memory blocks is erase-passed or erase-failed based on the entire number of fail strings, and store the determined erase-pass/fail result in the control logic unit 120.

Figure 21:
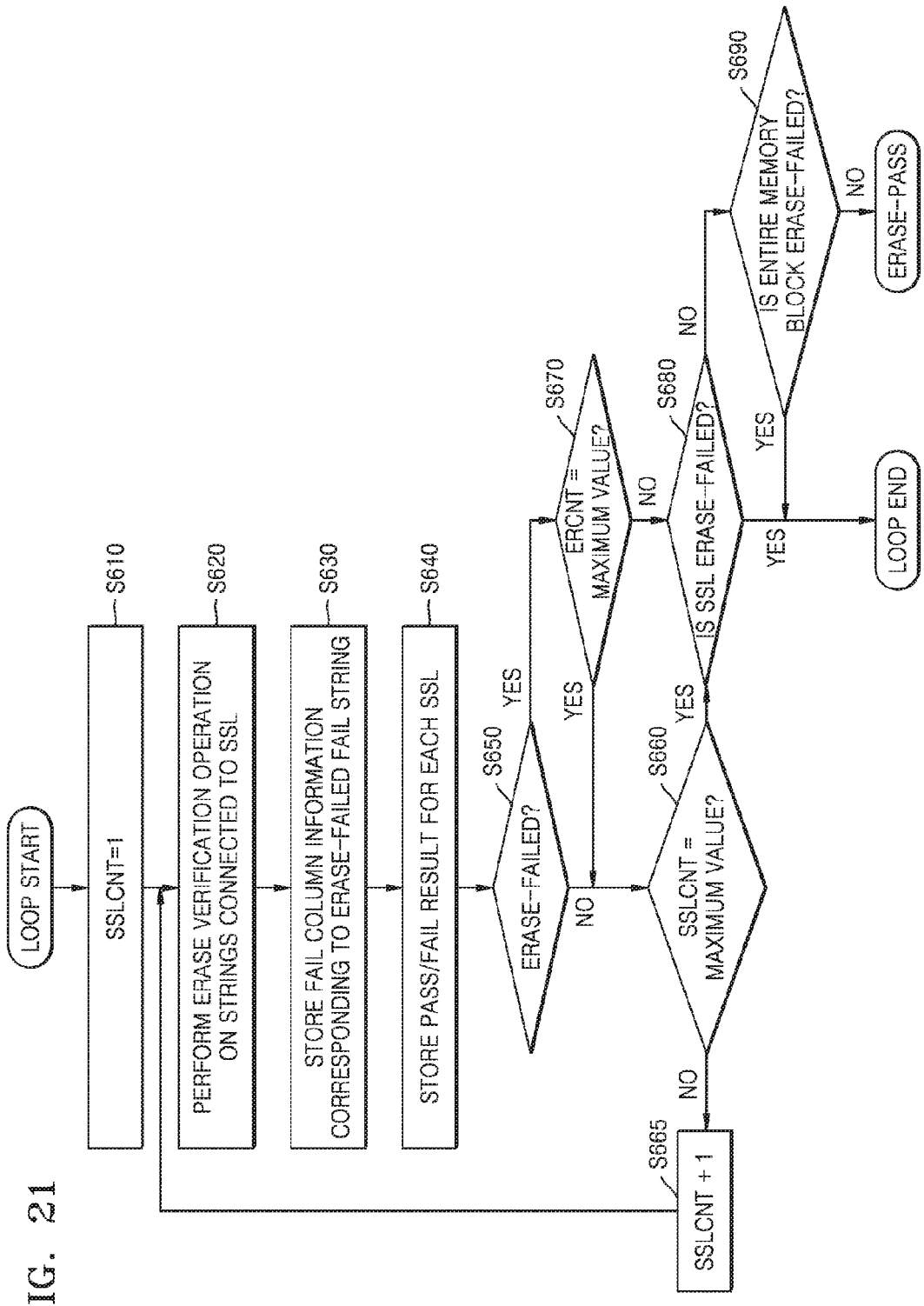
FIG. 21 is a detailed flowchart of a method of operating a memory device according to another exemplary embodiment.

FIG. 21 is a detailed flowchart of a method of operating a memory device according to another exemplary embodiment.

Referring to FIG. 21, the method of operating the memory device according to the present exemplary embodiment may include detailed operations of another example of the method of FIG. 19. Specifically, the method of operating the memory device according to the present exemplary embodiment may be a method of ascertaining whether each of the memory blocks is erase-passed or erase-failed. Detailed descriptions presented with reference to FIGS. 1 to 19 may be applied to the present exemplary embodiment.

In operation S610, a string selection line count SSLCNT may be 1. In operation S620, an erase verification operation may be performed on strings connected to a string selection line. In operation S630, fail column information corresponding to an erase-failed fail string, from among strings connected to the string selection line, may be stored.

In operation S640, an erase-pass/fail result for each string selection line may be stored. In operation S650, it may be determined whether a selected string selection line is erase-failed. If the selected string selection line is determined as erase-failed, operation S670 may be performed. If the selected string selection line is determined as erase-passed, operation S660 may be performed.

In operation S660, it may be determined whether the string selection line count SSLCNT is a maximum value. As a result, if the string selection line count SSLCNT is determined as the maximum value, operation S680 may be performed; otherwise, operation S665 may be performed. In operation S665, the string selection line count SSLCNT may be incremented. For example, the string selection line counter 122 may increment the string selection line count SSLCNT and output 2 as the string selection line count SSLCNT.

In operation S670, it may be determined whether the erase count ERCNT is a maximum value. If the erase count ERCNT is determined as the maximum value, operation S660 may be performed; otherwise, operation S680 may be performed. In operation S680, it may be determined whether there is an erase-failed string selection line from among string selection lines included in the memory block. As a result, even if there is only one erase-failed string selection line, an erase verification loop may be ended. If all the string selection lines are erase-passed, operation S690 may be performed.

In operation S690, it may be determined whether the entire memory block is erase-failed. If the entire memory block is determined as erase-failed, the erase verification loop may be ended; otherwise, the entire memory block may be determined as erase-passed. Specifically, even if all the string selection lines are determined as erase-passed as a result of an erase verification operation performed on each of the string selection lines, when the accumulated number of all fail bits is equal to or higher than a second critical number, the memory block may be determined as erase-failed.

Figure 22:
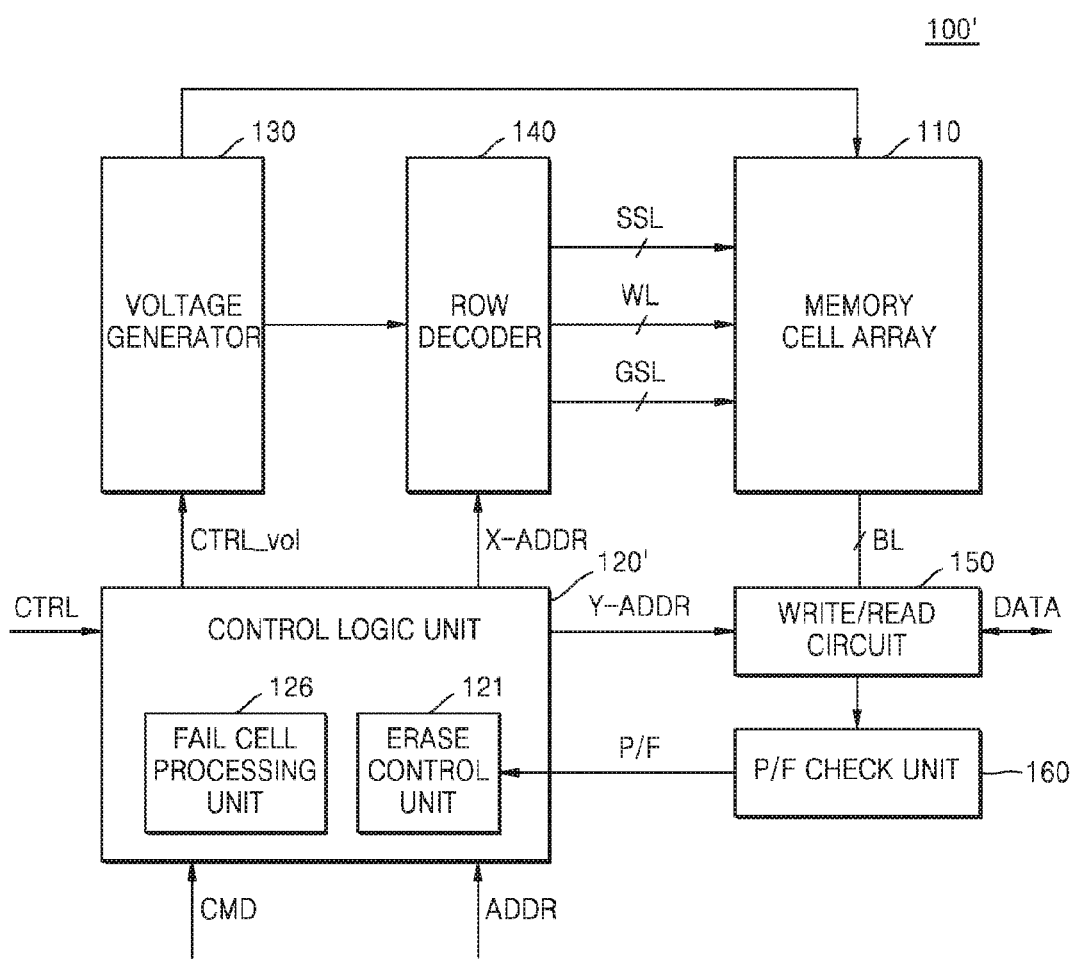
FIG. 22 is a block diagram of a memory device according to another exemplary embodiment.

FIG. 22 is a block diagram of a memory device 100' according to another exemplary embodiment.

Referring to FIG. 22, the memory device 100' may include a memory cell array 110, a control logic unit 120', a voltage generation unit 130, a row decoder 140, a write/read circuit 150, and a pass/fail check unit 160. The memory device 100' according to the present exemplary embodiment may be a modified example of the memory device 100 of FIG. 2. The memory device 100' according to the present exemplary embodiment may be substantially the same as the memory device 100 of FIG. 2 except for a configuration of the control logic unit 120'. Accordingly, detailed descriptions presented with reference to FIGS. 1 to 21 may be applied to the present exemplary embodiment, and repeated descriptions will be omitted.

The control logic unit 120' may include an erase control unit 121 and a fail cell processing unit 126. Although not shown in FIG. 22, the control logic unit 120' may further include a string selection line counter 122, an erase counter 123, a fail column number storage unit 124, and a pass/fail storage unit 125 as shown in FIG. 16. The erase control unit 121 may be substantially the same as the erase control unit 121 of FIG. 16. Detailed descriptions presented with reference to FIG. 16 may be applied to the present exemplary embodiment.

The fail cell processing unit 126 may process memory cells that are determined as erase-failed as a result of an erase verification operation. Specifically, the fail cell processing unit 126 may perform a repair operation or a bad cell processing operation on the memory cells that are determined as erase-failed. In an exemplary embodiment, the fail cell processing unit 126 may perform a repair operation or a bad string processing operation on fail strings based on fail column information. In another exemplary embodiment, the fail cell processing unit 126 may perform a repair operation or a bad string processing operation on strings connected to a string selection line that is determined as erase-failed based on the fail column information. In another exemplary embodiment, the fail cell processing unit 126 may perform a repair operation or a bad block processing operation on a memory block that is determined as erase-failed based on the fail column information.

Figure 23:
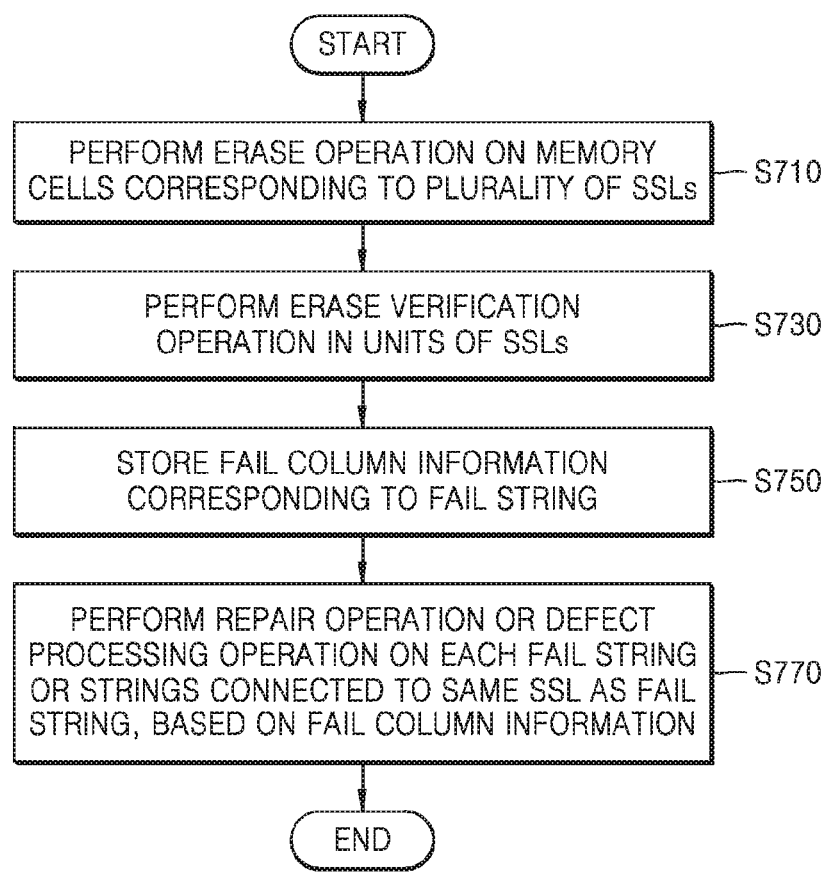
FIG. 23 is a flowchart of a method of operating a memory device according to another exemplary embodiment.

FIG. 23 is a flowchart of a method of operating a memory device according to another exemplary embodiment.

Referring to FIG. 23, the method of operating the memory device according to the present exemplary embodiment may include performing an erase operation and an erase verification operation on a plurality of memory cells included in a memory cell array and processing fail cells based on an erase verification result. Detailed descriptions presented with reference to FIGS. 1 to 22 may be applied to the method of operating the memory device according to the present exemplary embodiment.

In operation S710, an erase operation may be performed on memory cells corresponding to a plurality of string selection lines. In operation S730, an erase verification operation may be performed on the memory cells on which the erase operation has been performed, in units of string election lines. In operation S750, fail column information corresponding to an erase-failed fail string, from among strings connected to one string selection line, may be stored.

In operation S770, a repair operation or a defect processing operation may be performed on a fail string or strings connected to the same string selection line as the fail string, based on fail column information. For example, the fail cell processing unit 126 may perform a repair operation or a bad string processing operation on the fail string based on the fail column information. In another example, the fail cell processing unit 126 may perform a repair operation or a bad string processing operation on strings connected to a string selection line that is determined as erase-failed based on the fail column information.

Figure 24:
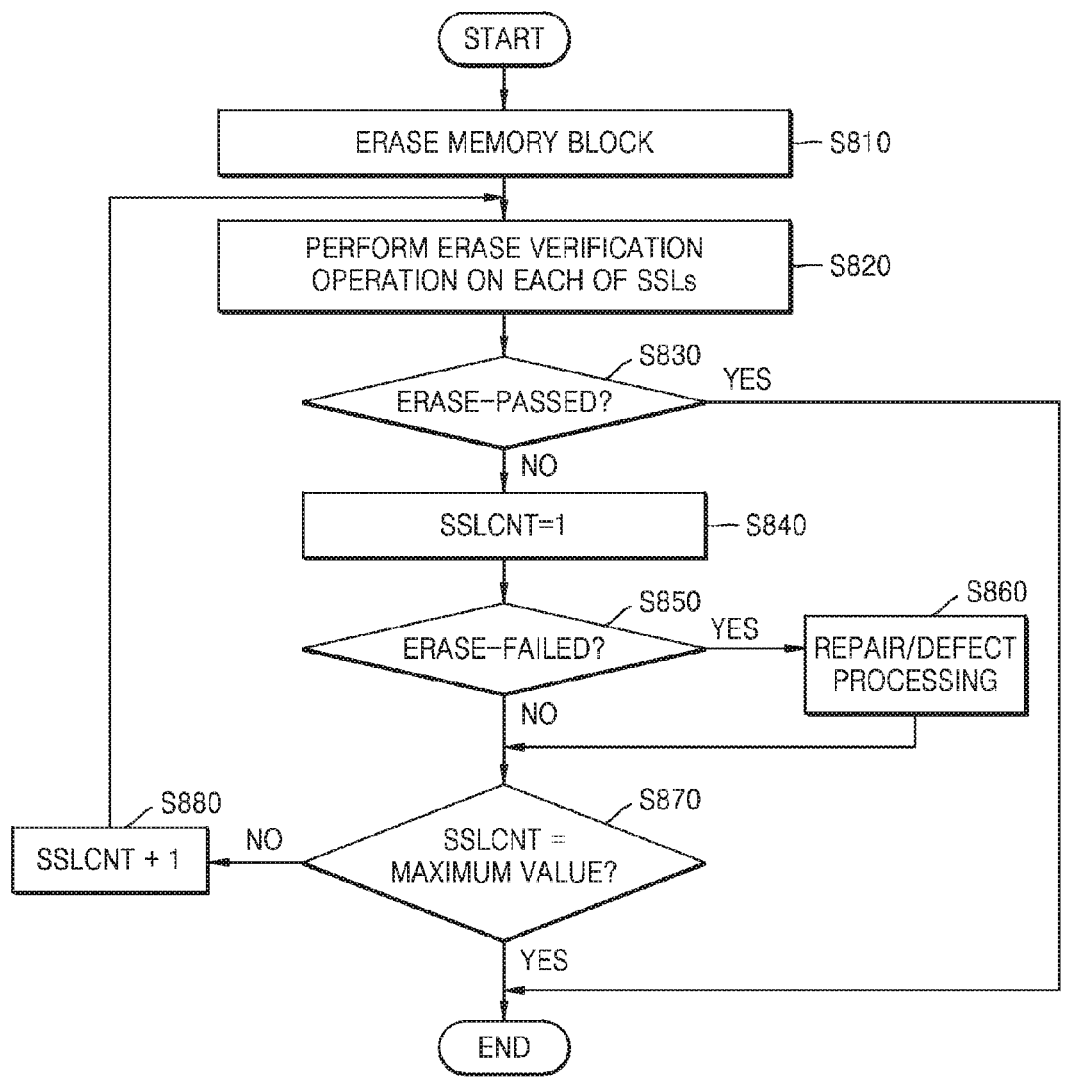
FIG. 24 is a detailed flowchart of a method of operating a memory device according to another exemplary embodiment.

FIG. 24 is a detailed flowchart of a method of operating a memory device according to another exemplary embodiment.

Referring to FIG. 24, the method of operating the memory device according to the present exemplary embodiment may include detailed operations of the method of FIG. 23. Detailed descriptions presented with reference to FIGS. 1 to 23 may be applied to the present exemplary embodiment.

In operation S810, a plurality of memory cells included in a memory block may be erased. In operation S820, an erase verification operation may be performed in units of string selection lines included in the memory block. Specifically, the erase verification operation may be sequentially performed on a plurality of string selection lines included in the memory block.

In operation S830, it may be determined whether the plurality of string selection lines included in the memory block are erase-passed. If the plurality of string selection lines are determined as erase-passed, the method may be ended. Otherwise, if the plurality of string selection lines are determined as erase-failed, operation S840 may be performed.

In operation S840, a string selection line count SSLCNT may be 1. In operation S850, a determination is made whether the selected string selection line is erase-failed. If the selected string selection line is determined as erase-failed, operation S860 may be performed. Otherwise, if the selected string selection line is determined as erase-passed, operation S870 may be performed. In operation S860, a repair operation/defect processing operation may be performed on the selected string selection line.

In operation S870, it may be determined whether the string selection line count SSLCNT is a maximum value. If the string selection line count SSLCNT is determined as the maximum value, the method may be ended; otherwise, operation S880 may be performed. In operation S880, the string selection line count SSLCNT may be incremented.

Figure 25:
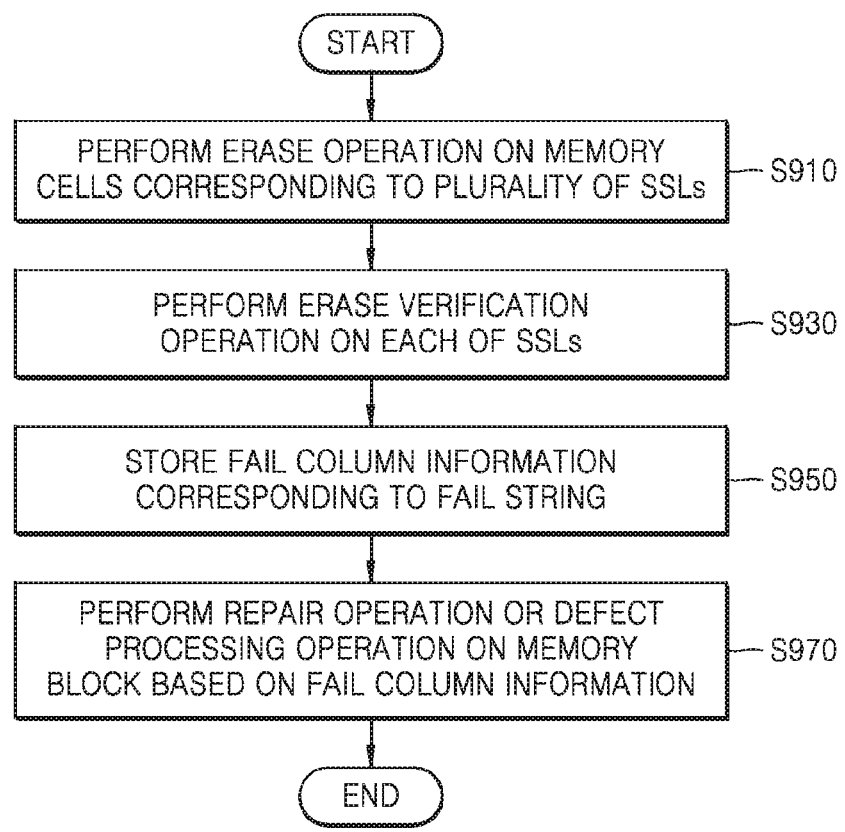
FIG. 25 is a flowchart of a method of operating a memory device according to another exemplary embodiment.

FIG. 25 is a flowchart of a method of operating a memory device according to another exemplary embodiment.

Referring to FIG. 25, the method of operating the memory device according to the present exemplary embodiment may be a modified example of the method of FIG. 23. Detailed descriptions presented with reference to FIGS. 23 and 24 may be applied to the present exemplary embodiment.

In operation S910, an erase operation may be performed on memory cells corresponding to the plurality of string selection lines. In operation S930, an erase verification operation may be performed on the memory cells on which the erase operation has been performed, in units of string selection lines. In operation S950, fail column information corresponding to an erase-failed fail string, from among strings connected to one string selection line, may be stored.

In operation S970, a repair operation or a defect processing operation may be performed on the memory block based on the fail column information. In an exemplary embodiment, when there is a string selection line that is determined as erase-failed based on the fail column information, a repair operation or a defect processing operation may be performed on the entire memory block including the corresponding string selection line. In another exemplary embodiment, when there is no string selection line that is determined as erase-failed, if the corresponding memory block is determined as erase-failed based on the fail column information, the repair operation or defect processing operation may be performed on the corresponding memory block.

Figure 26:
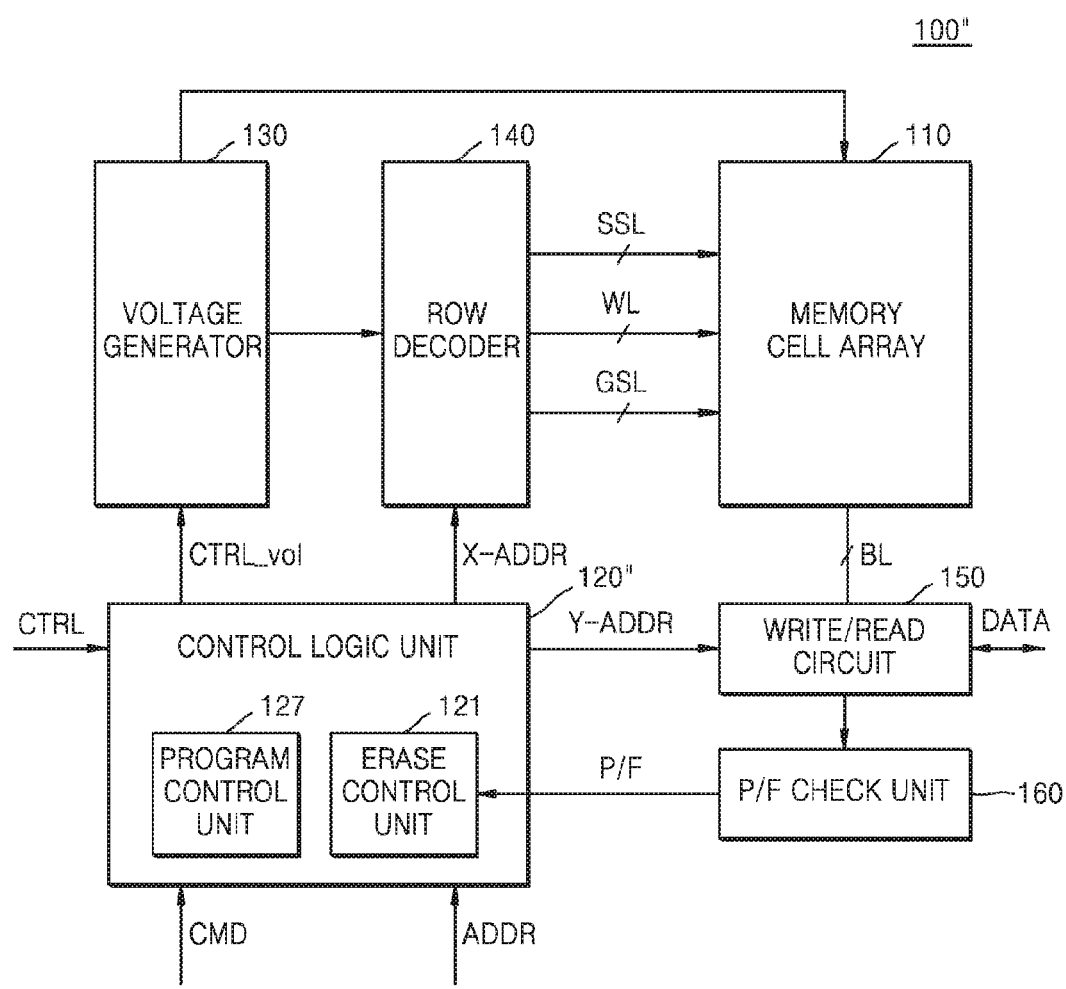
FIG. 26 is a block diagram of a memory device according to another exemplary embodiment.

FIG. 26 is a block diagram of a memory device 100" according to another exemplary embodiment.

Referring to FIG. 26, the memory device 100" may include a memory cell array 110, a control logic unit 120", a voltage generation unit 130, a row decoder 140, a write/read circuit 150, and a pass/fail check unit 160. Although not shown, the control logic unit 120" may further include the fail cell processing unit 126 shown in FIG. 22. The memory device 100" according to the present exemplary embodiment may be a modified example of the memory device 100 of FIG. 2. The memory device 100" of FIG. 2 may be substantially the same as the memory device 100 of FIG. 2 except for a configuration of the control logic unit 120". Accordingly, detailed descriptions presented with reference to FIGS. 1 to 25 may be applied to the present exemplary embodiment, and repeated descriptions will be omitted.

The control logic unit 120" may include an erase control unit 121 and a program control unit 127. Although not shown, control logic unit 120" may further include a string selection line counter 122, an erase counter 123, a fail column number storage unit 124, and a pass/fail storage unit 125 as shown in FIG. 16. The erase control unit 121 may be substantially the same as the erase control unit 121 shown in FIG. 16. Detailed descriptions presented with reference to FIG. 16 may be applied to the present exemplary embodiment.

When a program address including a fail column and a program command are received, the program control unit 127 may inhibit a program operation on the fail column and change a pattern of data loaded in the fail column. For example, when program data corresponding to a fail column is 0, the program control unit 127 may change data loaded in the corresponding fail column into 1 and inhibit a program operation on the corresponding fail column.

In an exemplary embodiment, the program control unit 127 may inhibit a program operation on a fail string based on the number of fail columns or locations of the fail columns during a program operation on a memory block corresponding to a plurality of string selection lines. For example, when a string NS11 is determined as the fail string as a result of an erase verification operation on each of the string selection lines, the fail column may include strings NS11, NS21, and NS31. In this case, when a program command for a program address including the fail string NS11 is received, the program control unit 127 may inhibit a program operation on only the fail string NS11.

In another exemplary embodiment, the program control unit 127 may inhibit a program operation on a plurality of strings corresponding to the fail column, based on the number of fail columns or locations of the fail columns during a program operation on the memory block corresponding to the plurality of string selection lines. For example, when a string NS11 is determined as the fail string as a result of an erase verification operation on each of the string selection lines, the fail column may include strings NS11, NS21, NS31. In this case, when a program command for a program address including the fail column (NS11, NS21, and NS31) is received, the program control unit 127 may inhibit a program operation on the fail column (NS11, NS21, and NS31).

In yet another exemplary embodiment, the program control unit 127 may inhibit a program operation on a memory block including fail strings based on the number of fail columns or locations of the fail columns during a program operation on a memory block corresponding to a plurality of string selection lines. For example, when a string NS11 is determined as the fail string as a result of an erase verification operation performed on each of the string selection lines, a fail column may include strings NS11, NS21, and NS31. In this case, when a program command for a program address including the fail string NS11 is received, the program control unit 127 may inhibit a program operation on the memory block BLK1 including the fail string NS11.

Figure 27:
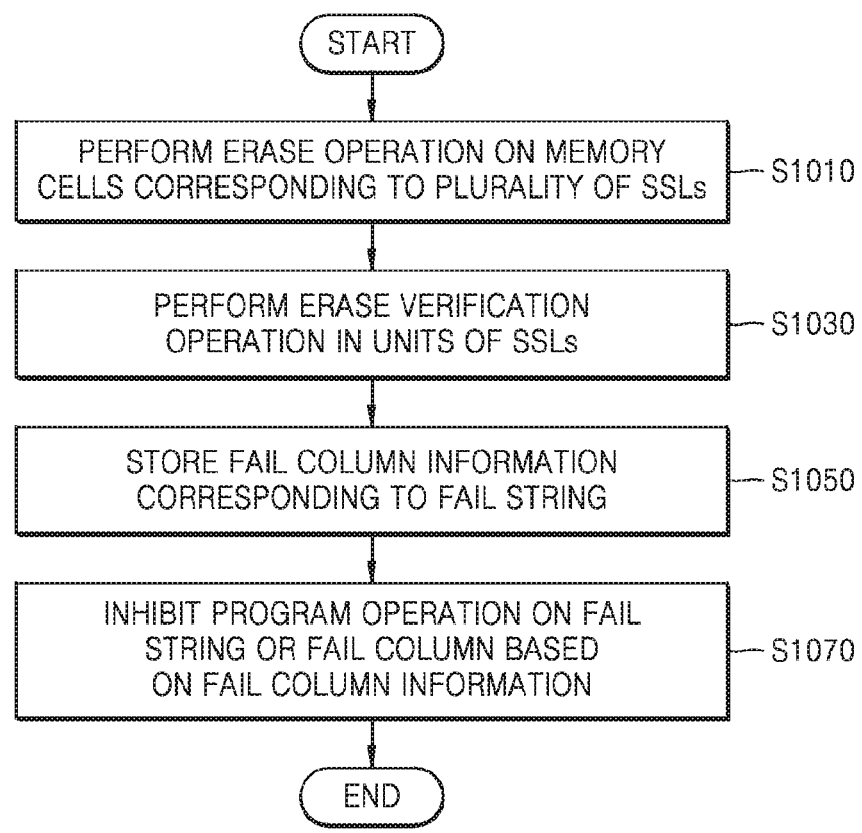
FIG. 27 is a flowchart of a method of operating a memory device according to another exemplary embodiment.

FIG. 27 is a flowchart of a method of operating a memory device according to another exemplary embodiment.

Referring to FIG. 27, the method of operating the memory device according to the present exemplary embodiment may include performing an erase operation and an erase verification on a plurality of memory cells included in a memory cell array and adaptively performing a program operation based on an erase verification result. Detailed descriptions presented with reference to FIGS. 1 to 26 may be applied to the method of operating the memory device according to the present exemplary embodiment.

In operation S1010, an erase operation may be performed on memory cells corresponding to a plurality of string selection lines. In operation S1030, an erase verification operation may be performed on the memory cells on which the erase operation has been performed, in units of string selection lines. In operation S1050, fail column information corresponding to an erase-failed fail string, from strings connected to one string selection line, may be stored.

In operation S1070, a program operation on the fail string or a fail column may be inhibited based on the fail column information. When a program address corresponds to the fail column, data loaded in the fail string or the fail column may be changed so that the program operation on the fail string or the fail column may be inhibited.

Figure 28:
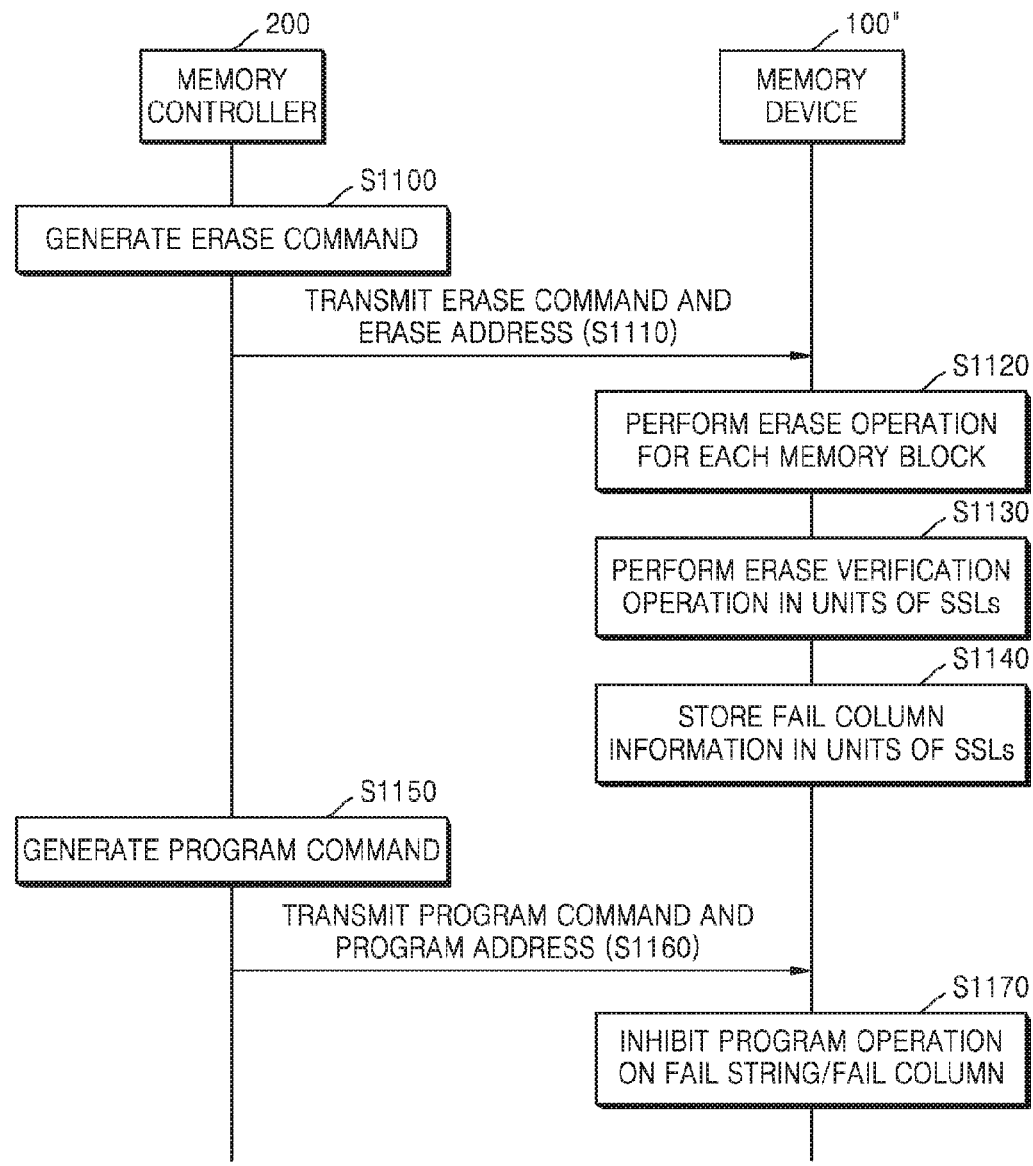
FIG. 28 is a flowchart of an operation of a memory system, in which the method of operating the memory device of FIG. 27 is used, according to an exemplary embodiment.

FIG. 28 is a flowchart of an operation of a memory system, in which the method of operating the memory device of FIG. 27 is used, according to an exemplary embodiment.

Referring to FIG. 28, in operation S1100, a memory controller 200 may generate an erase command. In operation S1110, the memory controller 200 may transmit an erase command and an erase address to a memory device 100". In operation S1120, the memory device 100" may perform an erase operation on each of multiple memory blocks. In operation S1130, the memory device 100" may perform an erase verification operation in units of string selection lines. In operation S1140, the memory device 100" may store fail column information in the units of string selection lines.

In operation S1150, the memory controller 200 may generate a program command. In operation S1160, the memory controller 200 may transmit a program command and a program address. In this case, the program address may be an address of memory cells corresponding to the fail column information. In operation S1170, the memory device 100" may inhibit a program operation on a fail string/a fail column. Specifically, a program operation may be inhibited by changing a data loading pattern for a program inhibition column.

Figure 29:
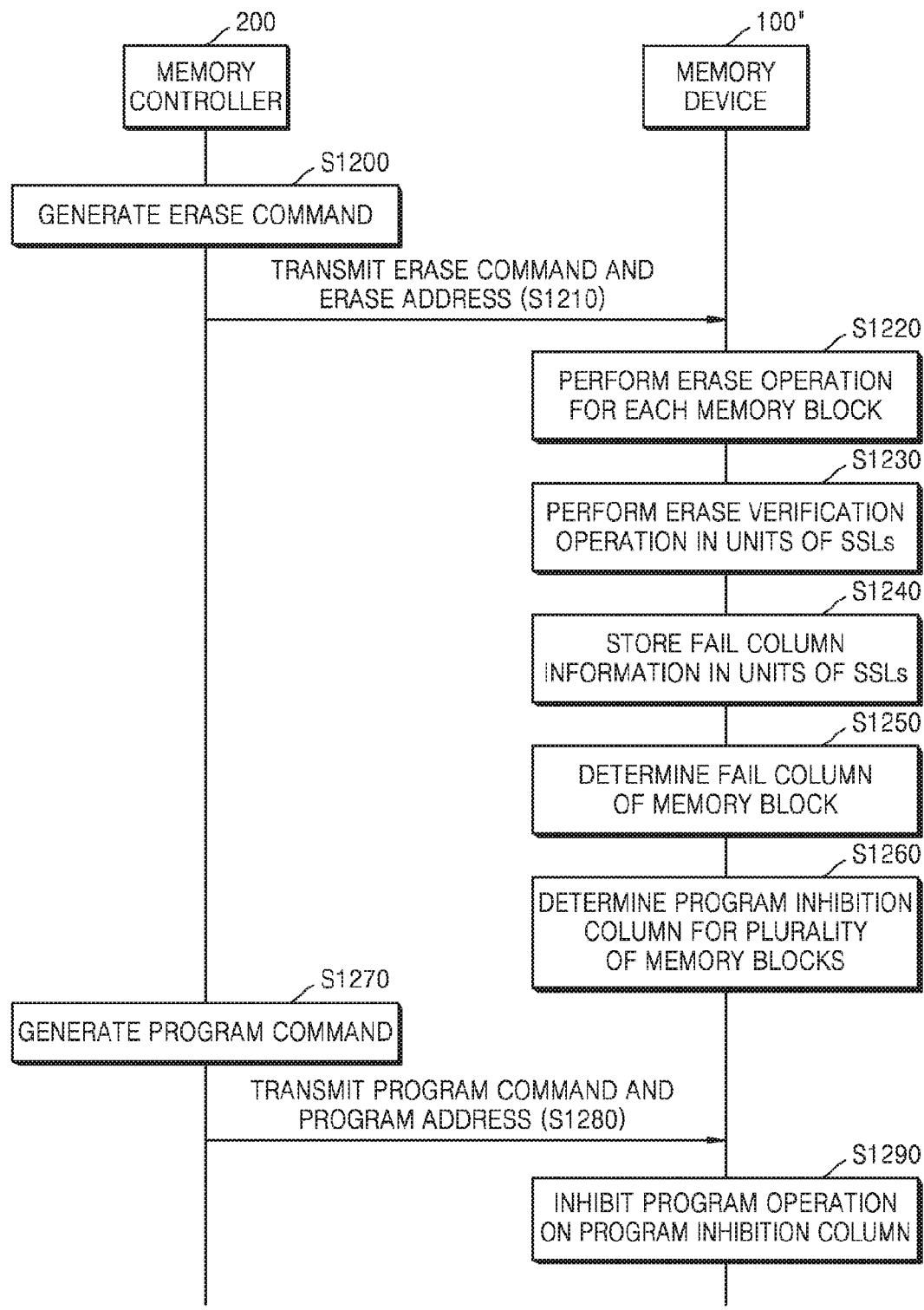
FIG. 29 is a flowchart of an operation of a memory system, in which the method of operating the memory device of FIG. 27 is used, according to another exemplary embodiment.

FIG. 29 is a flowchart of an operation of a memory system, in which the method of operating the memory device of FIG. 27 is used, according to another exemplary embodiment.

Referring to FIG. 29, in operation S1200, the memory controller 200 may generate an erase command. In operation S1210, the memory controller 200 may transmit an erase command and an erase address to a memory device 100". In operation S1220, the memory device 100" may perform an erase operation on each of multiple memory blocks. In operation S1230, the memory device 100" may perform an erase verification operation in units of string selection lines. In operation S1240, the memory device 100" may store fail column information in units of string selection lines.

In operation S1250, the memory device 100" may determine a fail column of a memory block. In an exemplary embodiment, a column in which at least one fail bit occurs may be determined as a fail column based on a result of an erase verification operation performed on each of a plurality of string selection lines included in the memory block. In another exemplary embodiment, a column in which at least a critical number of fail bits occur may be determined as a fail column as a result of an erase verification operation performed on each of the plurality of string selection lines included in the memory block. For example, when the critical number is 2, a column in which fail bits occur based on only a result of an erase verification operation performed on a first string selection line may be determined as not being a fail column.

In operation S1260, the memory device 100" may determine a program inhibition column for each column of a plurality of memory blocks. Specifically, when the number of times each of the columns of the plurality of memory blocks fails is equal to or higher than a critical value, the corresponding column may be determined as a program inhibition column.

Hereinafter, an operation of determining the program inhibition column will be described with reference to FIG. 30A.

FIG. 30A is a table showing fail columns of respective memory blocks according to an exemplary embodiment.

Referring to FIG. 30A, fail columns of a first memory block Block1 may be a first column Col.1 and a fifth column Col.5. Fail columns of a second memory block Block2 may be a first column Col.1 and a seventh column Col.7. Also, a fail column of an N-th memory block BlockN may be a first column Col.1. For example, when the number of times each of the columns fails is equal to or higher than 2, the corresponding column may be determined as a program inhibition column Thus, the first column Col.1 may be determined as the program inhibition column.

Referring back to FIG. 29, in operation S1270, the memory controller 200 may generate a program command. In operation S1280, the memory controller 200 may transmit a program command and a program address. In this case, the program address may be an address of memory cells corresponding to a program inhibition column. In operation S1290, the memory device 100" may inhibit a program operation on the program inhibition column. Specifically, a program operation may be inhibited by changing a data loading pattern for the program inhibition column Hereinafter, the program inhibition operation will be described with reference to FIG. 30B.

FIG. 30B is a table showing data loading patterns of respective columns according to an exemplary embodiment.

Referring to FIG. 30B, since the first column Col.1 is the program inhibition column, when program data corresponding to the first column Col.1 is data '0', loading data may be changed to '1' so that a program operation cannot be performed on the first column Col.1. According to the present exemplary embodiment as described above, a program operation may be inhibited from being performed on the fail column to prevent occurrence of a program failure.

Figure 31:
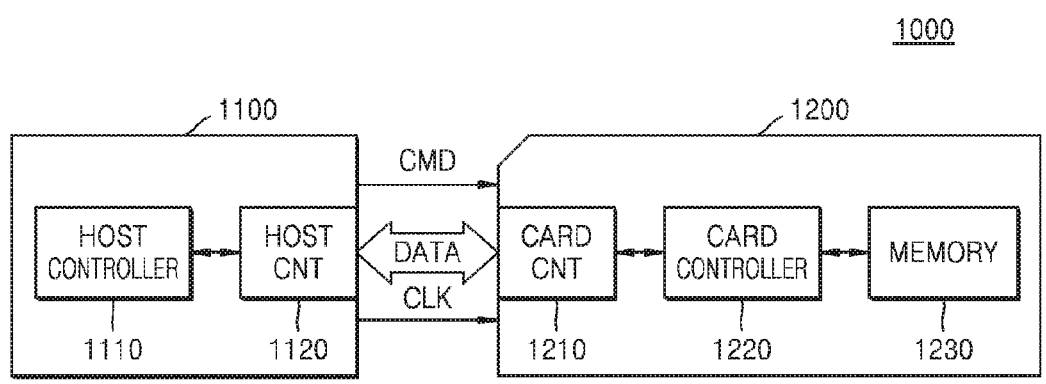
FIG. 31 is a block diagram of an example of applying a memory system according to exemplary embodiments to a memory card system.

FIG. 31 is a block diagram of an example of applying a memory system 1000 according to exemplary embodiments to a memory card system.

Referring to FIG. 31, the memory card system 1000 may include a host 1100 and a memory card 1200. The host 1100 may include a host controller 1110 and a host connector 1120. The memory card 1200 may include a card connector 1210, a card controller 1220, and a memory device 1230. In this case, the memory card 1200 may be embodied according to the exemplary embodiments shown in FIGS. 1 to 30.

The host 1100 may write data in the memory card 1200 or read data stored in the memory card 1200. A host controller 1110 may transmit a command CMD, a clock signal CLK generated by a clock generator (not shown) of the host 1100, and data DATA through a host connector 1120 to the memory card 1200.

In response to a command received through the card connector 1210, the card controller 1220 may be synchronized with a clock signal generated by a clock generator (not shown) of the card controller 1220 and store data in the memory device 1230. The memory device 1230 may store data transmitted from the host 1100.

The memory card 1200 may be embodied by a compact flash card (CFC), a microdrive, a smart media card (SMC), a multimedia card (MMC), a security digital card (SDC), a memory stick, or a universal serial bus (USB) flash memory driver.

Figure 32:
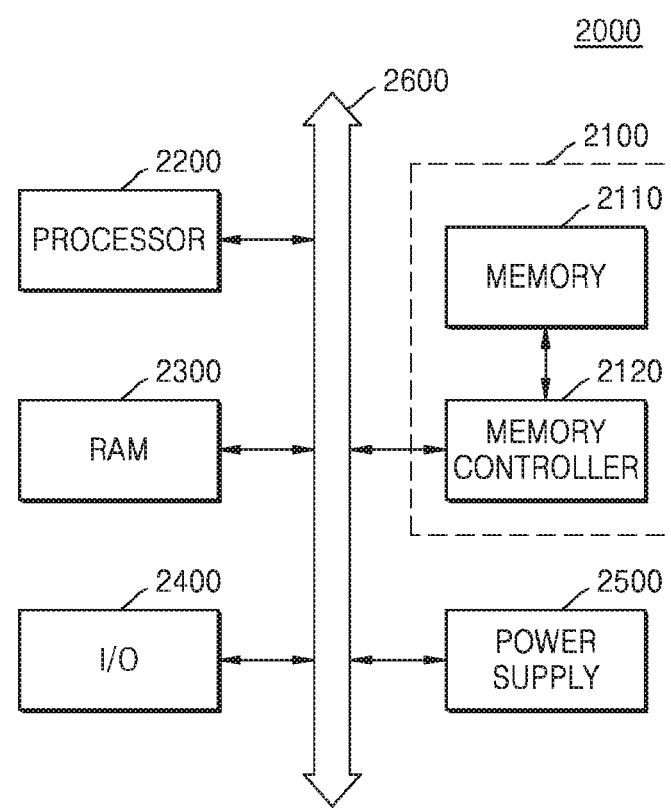
FIG. 32 is a block diagram of a computing system including a memory system according to exemplary embodiments.

FIG. 32 is a block diagram of a computing system 2000 including a memory system 2100 according to exemplary embodiments.

Referring to FIG. 32, the computing system 2000 may include a memory system 2100, a processor 2200, a random access memory (RAM) 2300, an input/output (I/O) device 2400, and a power supply 2500. Although not shown in FIG. 32, the computing system 2000 may further include ports, which may communicate with a video card, a sound card, a memory card, or a universal serial bus (USB) device or communicate with other electronic devices. The computing system 2000 may be embodied by a personal computer (PC) or a portable electronic device, such as a laptop computer, a portable phone, a personal digital assistant (PDA), and a camera.

The processor 2200 may perform specific calculations or tasks. In some embodiments, the processor 2200 may be a microprocessor (MP) or a central processing unit (CPU). The processor 2200 may communicate with the RAM 2300, the I/O device 2400, and the memory system 2100 through a bus 2600, such as an address bus, a control bus, and a data bus. The memory system 2100 may include a memory 2110 and a memory controller 2120 in accordance with embodiments of the memories and memory controllers described herein. More specifically, the memory system 2100 may be embodied according to the exemplary embodiments shown in FIGS. 1 to 31.

In some embodiments, the processor 2200 may be also connected to an expansion bus, such as a peripheral component interconnect (PCI) bus.

The RAM 2300 may store data required for an operation of the computing system 2000. For example, the RAM 2300 may be embodied by a dynamic random access memory (DRAM), a mobile DRAM, a static RAM (SRAM), a phase-change RAM (PRAM), a ferroelectric RAM (FRAM), a resistive RAM (RRAM), and/or a magnetic RAM (MRAM).

The I/O device 2400 may include an input unit, such as a keyboard, a keypad, and a mouse, and an output unit, such as a printer and a display. The power supply 2500 may supply an operating voltage required for an operation of the computing system 2000.

Figure 33:
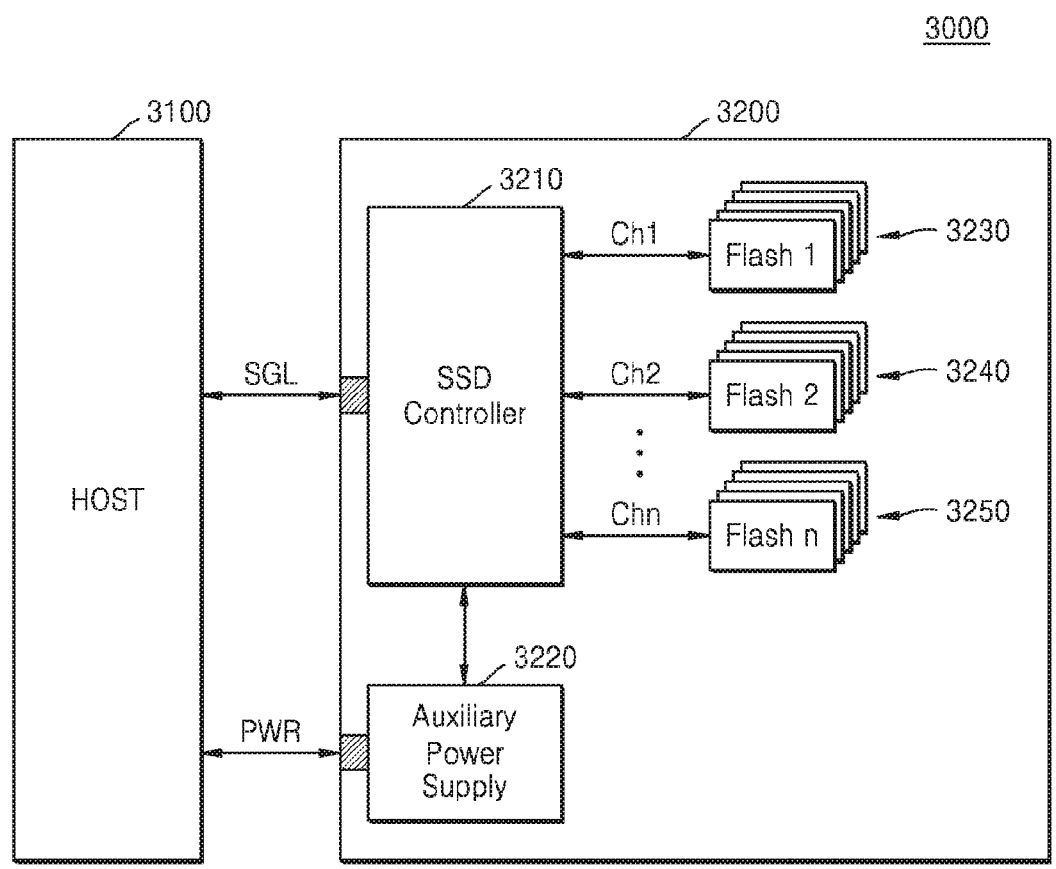
FIG. 33 is a block diagram of an example of applying a memory system, according to exemplary embodiments, to a solid-state disk (SSD) system.

FIG. 33 is a block diagram of an example of applying a memory system, according to exemplary embodiments, to a solid-state disk (SSD) system.

Referring to FIG. 33, the SSD system 3000 may include a host 3100 and an SSD 3200. The SSD 3200 may exchange signals SGL with the host 3100 through a signal connector and receive power PWR through a power connector. The SSD 3200 may include an SSD controller 3210, an auxiliary power supply 3220, and a plurality of memory devices 3230, 3240, and 3250. The SSD controller 3210 communicates with the memory devices 3230, 3240, . . . 3250 through channels Ch1, Ch2, . . . Chn, respectively. In this case, the SSD 3200 may be embodied according to the exemplary embodiments shown in FIGS. 1 to 32.

While the disclosure has been particularly shown and described with reference to exemplary embodiments thereof, it will be understood that various changes in form and details may be made therein without departing from the spirit and scope of the following claims.

What is claimed is:

1. A method of operating a non-volatile memory device including a plurality of strings, each string including a plurality of memory cells vertically stacked on a substrate, the method comprising:
    performing an erase operation on memory cells corresponding to a plurality of string selection lines;
    performing an erase verification operation on first strings connected to a first string selection line from among the plurality of string selection lines;
    storing fail column information corresponding to a first fail string, which is erase-failed, from among the first strings; and
    performing an erase verification operation on second strings connected to a second string selection line from among the plurality of string selection lines, when the first strings are erase-passed.

2. The method of claim 1, wherein the fail column information is the number of fail columns corresponding to the first fail string.

3. The method of claim 2, further comprising determining whether the first strings connected to the first string selection line are erase-passed or erase-failed based on the fail column information.

4. The method of claim 3, wherein the determining of whether the first strings connected to the first string selection line are erase-passed or erase-failed comprises determining the first strings connected to the first string selection line as erase-failed when the number of the fail columns is equal to or higher than a critical number.

5. The method of claim 2, further comprising:
    obtaining the number of all fail strings of a memory block corresponding to the plurality of string selection lines by accumulating the number of the fail columns of the plurality of string selection lines; and
    determining whether the memory block is erase-passed or erase-failed based on the obtained number of all the fail strings.

6. The method of claim 5, wherein the determining of whether the memory block is erase-passed or erase-failed comprises determining the memory block as erase-failed when the number of all the fail strings is equal to or higher than a critical number.

7. The method of claim 6, further comprising performing a repair operation or a bad block processing operation on the erase-failed memory block.

8. The method of claim 1, further comprising performing a repair operation or a bad string processing operation on the first strings when the first strings are erase-failed.

9. The method of claim 1, further comprising performing a repair operation or a bad string processing operation on the first fail string, from among the first strings, when the first strings are erase-failed.

10. The method of claim 1, wherein the fail column information includes a location of a fail column corresponding to the first fail string.

11. The method of claim 10, further comprising:
    inhibiting a program operation on the first fail string, based on the location of the fail column, during a program operation on a memory block corresponding to the plurality of string selection lines; or
    inhibiting a program operation on a plurality of strings corresponding to the fail column, based on the location of the fail column, during the program operation on the memory block.

12. The method of claim 10, further comprising:
    determining a fail column of a memory block based on a location of a fail column in each of the plurality of string selection lines;
    determining a program inhibition column based on the location of the fail column in each of a plurality of memory blocks; and
    inhibiting a program operation on the program inhibition column during a program operation on the plurality of memory blocks.

13. The method of claim 12, wherein the determining of the program inhibition column comprises determining each of columns of a plurality of memory blocks as the program inhibition column when the number of failures for each column is equal to or higher than a critical number.

14. A method of operating a memory system including a non-volatile memory device including a plurality of strings, each string including a plurality of memory cells vertically stacked on a substrate, and a memory controller configured to control the non-volatile memory device, the method comprising:
    transmitting an erase command and an erase address from the memory controller to the non-volatile memory device;
    performing an erase operation on memory cells corresponding to a plurality of string selection lines according to the erase address in response to the erase command and the erase address;
    performing an erase verification operation on first strings connected to a first string selection line from among the plurality of string selection lines;
    performing an erase verification operation on second strings connected to a second string selection line from among the plurality of string selection lines, when the first strings are erase-passed; and
    performing an erase operation again on the memory cells when the first strings are erase-failed,
    wherein the performing of the erase verification operation on the first strings comprises:
    applying an erase verification voltage to the first strings; and
    storing fail column information corresponding to a first fail string, which is erase-failed, from among the first strings.

15. The method of claim 14, wherein the fail column information includes the number of first fail strings or locations of the first fail strings.

16. A method executed by a non-volatile memory comprising a plurality of first strings, each of the first strings comprising a plurality of first memory cells commonly addressed by one of a plurality of bit lines and each of the first strings commonly addressed by a first string selection line and a different one of the plurality of bit lines, the method comprising:

executing an erase operation on the first memory cells of the first strings addressed by the first string selection line and the bit lines;

executing an erase-verification operation on the first memory cells of the first strings addressed by the first string selection line and the bit lines; and determining separately for each of the first strings commonly addressed by the first string selection line and a different one of the bit lines whether all first memory cells of the first string are erased, based upon the outcome of the executed erase-verification operation.

17. The method of claim 16, wherein the non-volatile memory further comprises a plurality of second strings, each of the second strings comprising a plurality of second memory cells commonly addressed by one of the plurality of bit lines and each of the second strings commonly addressed by a second string selection line and a different one of the plurality of bit lines, the method further comprising:

comparing the number of first strings having a memory cell that was determined not to have been erased with a threshold number; and determining whether to perform the erase-verification operation on the second memory cells of the second strings addressed by the second string selection line based upon the outcome of the comparison.

18. The method of claim 16, wherein the non-volatile memory further comprises N additional string selection lines, N being an integer greater than zero, each of the N strings comprising a plurality of Nth memory cells commonly addressed by one of the plurality of bit lines and each of the N strings commonly addressed by an Nth string selection line and a different one of the plurality of bit lines, the method comprising:

executing, for each of the N string selection lines, the erase operation on the Nth memory cells of the Nth strings addressed by the Nth string selection lines and the bit lines;

executing, for each of the N string selection lines, the erase-verification operation on the Nth memory cells of the Nth strings addressed by the Nth string selection line and the bit lines; and executing, for each of the N string selection lines, the operation of:

determining separately for each of the Nth strings commonly addressed by the Nth string selection line and a different one of the bit lines whether all Nth memory cells of the Nth string are erased, based upon the outcome of the erase-verification operations executed on the N string selection lines.

19. The method of claim 16, further comprising inhibiting a program operation on the first memory cells addressed by the first string selection line when the number of first strings having a memory cell that was determined not to have been erased exceeds a threshold number.

20. The method of claim 18, further comprising inhibiting a program operation on memory cells commonly addressed by a first bit line of the plurality of bit lines when the number of strings addressed by the first bit line having a memory cell that was determined not to have been erased exceeds a threshold number.

* * * * *